United States Patent
Lin et al.

(10) Patent No.: US 10,230,470 B2
(45) Date of Patent: Mar. 12, 2019

(54) MULTILAYERED FLEXIBLE PRINTED CIRCUIT WITH BOTH RADIO FREQUENCY (RF) AND DC TRANSMISSION LINES ELECTRICALLY ISOLATED FROM EACH OTHER AND AN OPTICAL TRANSCEIVER USING SAME

(71) Applicant: Applied Optoelectronics, Inc., Sugar Land, TX (US)

(72) Inventors: Kai-Sheng Lin, Sugar Land, TX (US); Yi Wang, Katy, TX (US); Kevin Liu, Houston, TX (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 93 days.

(21) Appl. No.: 15/475,082

(22) Filed: Mar. 30, 2017

(65) Prior Publication Data
US 2018/0287705 A1    Oct. 4, 2018

(51) Int. Cl.
*G02B 6/42*    (2006.01)
*H04B 10/40*    (2013.01)
(Continued)

(52) U.S. Cl.
CPC ......... *H04B 10/40* (2013.01); *G02B 6/12004* (2013.01); *G02B 6/12009* (2013.01); *G02B 6/421* (2013.01); *G02B 6/4246* (2013.01); *G02B 6/4256* (2013.01); *G02B 6/4262* (2013.01); *G02B 6/4281* (2013.01); *H05K 1/028* (2013.01);
(Continued)

(58) Field of Classification Search
CPC ...... H04B 10/40; G02B 6/4256; H05K 1/028; H05K 5/0026
See application file for complete search history.

(56) References Cited

U.S. PATENT DOCUMENTS 7,130,194 B2 * 10/2006 Togami ............... G02B 6/4246
                                                                385/92
7,273,381 B2 *  9/2007 Ito ..................... H01R 12/58
                                                                439/79
(Continued)

OTHER PUBLICATIONS

Flexible Circuit Technologies, "Flexible Circuit and Heater Design Guide", www.flexiblecircuit.com, Copyright 2017, pp. 1-22.
(Continued)

*Primary Examiner* — Akm E Ullah
(74) *Attorney, Agent, or Firm* — Grossman Tucker Perreault & Pfleger, PLLC

(57) ABSTRACT

In accordance with an embodiment, a multi-layered flexible printed circuit (FPC) is disclosed that includes two or more insulating layers to route conductive traces carrying radio frequency (RF) signals, e.g., data signals, and conductive traces carrying direct current (DC) signals, e.g., power signals and low-frequency control signals, while sufficiently isolating the RF signals from electrical interference by the DC transmission lines. This advantageously eliminates having two or more separate FPCs to electrically couple each optical subassembly, e.g., receiver optical subassemblies (ROSAs) and transmitter optical subassemblies (TOSAs), to associated circuitry in a transceiver housing, which saves space and reduces manufacturing complexity, for example.

20 Claims, 11 Drawing Sheets

(51) Int. Cl.
*H05K 1/18* (2006.01)
*H05K 1/02* (2006.01)
*G02B 6/12* (2006.01)
*H05K 1/11* (2006.01)

(52) U.S. Cl.
CPC .......... *H05K 1/0218* (2013.01); *H05K 1/118* (2013.01); *H05K 1/189* (2013.01); *H05K 2201/052* (2013.01); *H05K 2201/09672* (2013.01); *H05K 2201/10189* (2013.01)

(56) References Cited

U.S. PATENT DOCUMENTS

| | | | |
|---|---|---|---|
| 7,798,820 B2 * | 9/2010 | Hong | H05K 1/117 385/92 |
| 8,083,415 B2 * | 12/2011 | Moore | G02B 6/4201 385/75 |
| 8,983,406 B2 * | 3/2015 | Zhang | H03F 1/3205 330/307 |
| 2014/0286636 A1 * | 9/2014 | Jiang | H04B 10/40 398/45 |
| 2016/0192545 A1 * | 6/2016 | Mao | H04B 10/40 398/136 |

OTHER PUBLICATIONS

All flex Flexible Circuits & Heaters, "Flexible Circuit & Heater Design Guide", www.allflexinc.com, Revised Aug. 2013, pp. 1-26.

* cited by examiner

MULTILAYERED FLEXIBLE PRINTED CIRCUIT WITH BOTH RADIO FREQUENCY (RF) AND DC TRANSMISSION LINES ELECTRICALLY ISOLATED FROM EACH OTHER AND AN OPTICAL TRANSCEIVER USING SAME

TECHNICAL FIELD

The present disclosure is related to optical transceiver modules and more particularly to an optical transceiver module that includes a multilayered flexible printed circuit.

BACKGROUND

Optical transceivers are used to transmit and receive optical signals for various applications including, without limitation, internet data centers, cable TV broadband, and fiber to the home (FTTH) applications. Optical transceivers provide higher speeds and bandwidth over longer distances, for example, as compared to transmission over copper cables. The desire to provide higher speeds in smaller optical transceiver modules for a lower cost has presented challenges, for example, with respect to maintaining optical efficiency (power), thermal management, and manufacturing yield. Optical transceivers can include one or more transmitter optical subassemblies (TOSAs) and receiver optical subassemblies (ROSAs) for the purpose of transmitting and receiving optical signals. As channel density and increased speed becomes an increasingly important aspect of optical transceivers, the ability to scale-down while maintaining nominal transceiver performance raises numerous non-trivial challenges.

BRIEF DESCRIPTION OF THE DRAWINGS

These and other features and advantages will be better understood by reading the following detailed description, taken together with the drawings, wherein.

DETAILED DESCRIPTION

Figure 1:
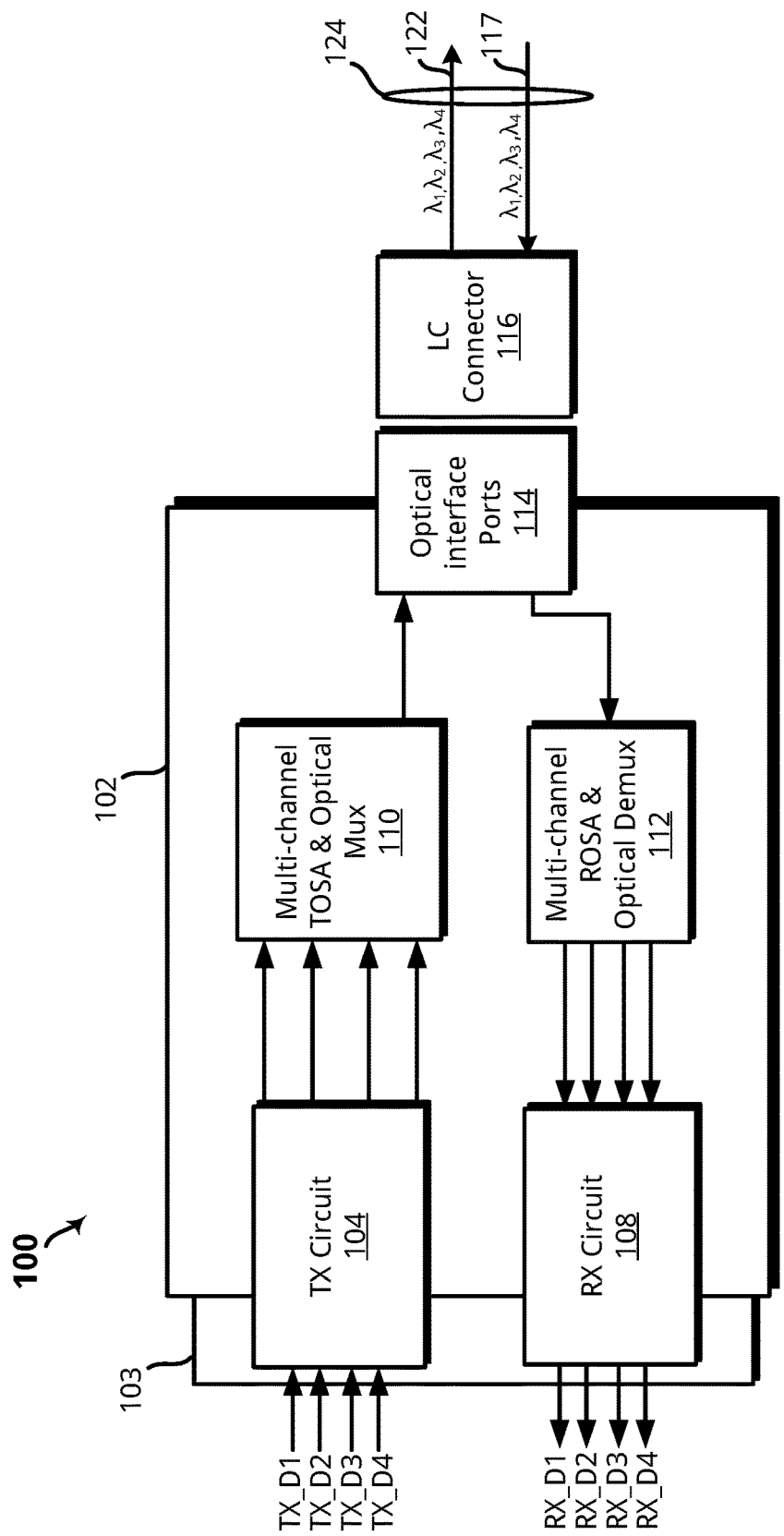
FIG. 1 schematically illustrates an embodiment of an optical transceiver including a multi-channel transmitter optical subassembly (TOSA) and multi-channel receiver optical subassembly (ROSA), in accordance with an embodiment of the present disclosure.

Optical transceiver modules often include transmitter optical subassemblies (TOSAs) and receiver optical subassemblies (ROSAs) within a housing or body. An optical transceiver module may operate as a single channel transceiver with one transmitter or one receiver, or as multi-channel transceiver with multiple transmitters and receivers such as the one outlined within the "QSFP+28 Gb/s 4× Pluggable Transceiver Solution (QSFP28)" specification published on Jun. 29, 2015 by the SFF Committee. Such small form-factor housings introduce significant dimensional constraints that reduce the overall workspace within a transceiver housing which increases manufacturing complexity, error rates, and overall time to produce each optical transceiver module.

One approach to increasing the workspace within the optical transceiver module involves using a bifurcated/multi-piece optical transceiver module housing having at least two separate portions. The TOSA is mounted to the first portion of the housing and the ROSA is mounted to the second portion of the housing, for example. In other words, the TOSA is coupled to a housing portion separate from that of the ROSA. As a result, the workspace available to a technician to couple the TOSA and the ROSA to respective portions of the housing is effectively increased when compared to the situation where the TOSA and the ROSA are each coupled to the same portion of the housing, e.g., in a stacked or sandwich configuration. In some instances, the workspace may be advantageously doubled. When the TOSA and ROSA are coupled to the respective portions of the housing, the first housing portion may be coupled to the second housing portion such that the ROSA housing portion is "flipped-over" the TOSA housing portion and attached in an up-side down fashion. In other words, when assembled, the TOSA is opposite the ROSA within the assembled housing. Therefore, the optical transceiver module may generally be described as having a flip-over housing, which is described in more detail in U.S. application Ser. No. 15/242,017 ('017 application) filed on Aug. 19, 2016, titled "An Optical Transceiver Module Having a Partitioned Housing," which is herein incorporated by reference in its entirety.

Another component that complicates manufacture of optical transceiver modules includes interconnect devices for coupling power and RF signals to TOSA and ROSA components. For example, a first flexible printed circuit (FPC) is used to electrically couple laser devices of a TOSA device to associated driver circuitry and a second FPC is used to electrically power and control the laser devices. Accordingly, each of the first and second FPCs must be carefully routed and coupled within a transceiver housing to as to avoid sensitive components and prevent inadvertent damage to components. Moreover, each FPC takes up space within already highly-constrained SFF housings.

In accordance with an embodiment, a multi-layered flexible printed circuit (FPC) is disclosed that includes two or more insulating layers to route conductive traces carrying radio frequency (RF) signals, e.g., data signals, and conductive traces carrying direct current (DC) signals, e.g., power signals and low-frequency control signals, while sufficiently isolating the RF signals from electrical interference by the DC lines. This advantageously eliminates having two or more separate FPCs to electrically couple each optical subassembly, e.g., a receiver optical subassembly (ROSA) and transmitter optical subassembly (TOSA), to associated circuitry in a transceiver housing, which saves space and reduces manufacturing complexity, for example.

In an embodiment, a multi-layer FPC consistent with the present disclosure includes at least two insulating layers in a stacked/sandwich configuration. A first insulating layer, which may be referred to as a top layer, may include a mounting surface for mounting electrical components, terminals, and so on. A first plurality of conductive traces may be disposed on the first insulating layer to provide an RF signal to one or more electrical components mounted to the mounting surface. The first insulating layer may be disposed, e.g., directly or by one or more intermediate layers, on a second insulating layer, with the second insulating layer acting as an RF ground reference plane. In particular, a second plurality of conductive traces may be disposed on a first surface of the second insulating layer adjacent to the first insulating layer to provide a ground signal. A third plurality of conductive traces may be disposed on a second surface of the second insulating layer to transmit a DC signal, e.g., power and/or low-frequency control signaling, with the second surface being opposite the first surface. Vias may be utilized to route the conductive traces through the first and second insulating layers to the mounting surface to electrically couple to one or more electrical components mounted thereon.

When using an FPC having multiple layers as variously disclosed herein, e.g., having at least one layer for DC signals and at least one separate layer for RF signals, the separation (or offset) distance between conductive traces may be selected to ensure nominal performance. For example, a separation (or spacing) distance between conductive traces transmitting RF signals may be increased, e.g., to 1 mm or more, to minimize or otherwise eliminate interference between conductive traces in a same insulating layer. Conversely, conductive traces carrying low-frequency signals, e.g., ground, power and control signals, may not interfere with each other and may have separation distances that are relatively close to each other, e.g., within 0.1 mm or less.

An FPC having a multilayer configuration in accordance with the present disclosure may also increase the space available for routing each conductive trace. For example, separating conductive traces between insulating layers allows each type of trace (e.g., RF carrying traces, ground reference traces, power and low frequency control signal carrying traces) to be routed without necessarily being concerned with placement of other conductive traces that may potentially interfere and reduce signal integrity. Stated differently, each insulation layer provides associated conductive traces with a plane that is separate and isolated from other conductive traces in neighboring insulation layers. Moreover, having conductive traces that operate as an RF ground reference plane may further electrically isolate conductive traces carrying RF signals from those carrying DC power and low-frequency control signals.

An FPC configured in accordance with the present disclosures provides numerous advantageous over other approaches to electrical interconnection within optical transceivers and transmitters. For example, the use of a single FPC that provides both RF transmission and DC lines/traces reduces the overall number of components within a given optical transceiver (e.g., by eliminating the necessity of two or more FPCs per optical subassembly) which results in space savings and reduces the complexity of manufacturing. This may further result in increased yield as the potential for component damage is reduced and overall assembly time per unit is decreased.

While the disclosure herein generally refers to a transceiver module/housing having a flip-over housing, an multilayer FPC consistent with the present disclosure may be utilized by other types of housing configurations. The use the of the term DC to refer to traces that carry power signals is not intended to be limited to DC current and may also carry other forms of signaling including low-frequency control signals.

As used herein, "channel wavelengths" refer to the wavelengths associated with optical channels and may include a specified wavelength band around a center wavelength. In one example, the channel wavelengths may be defined by an International Telecommunication (ITU) standard such as the ITU-T dense wavelength division multiplexing (DWDM) grid or coarse wavelength division multiplexing (CWDM) grid. The term "coupled" as used herein refers to any connection, coupling, link or the like and "optically coupled" refers to coupling such that light from one element is imparted to another element. Such "coupled" devices are not necessarily directly connected to one another and may be separated by intermediate components or devices that may manipulate or modify such signals.

Now turning to FIG. 1, there is an optical transceiver 100 consistent with embodiments of the present disclosure. In more detail, the optical transceiver 100 transmits and receives four (4) channels using four different channel wavelengths ($\lambda_1$, $\lambda_2$, $\lambda_3$, $\lambda_4$) and may be capable of transmission rates of at least about 25 gigabits (Gbs) per channel or more. In one example, the channel wavelengths $\lambda_1$, $\lambda_2$, $\lambda_3$, $\lambda_4$ may be 1271 nm, 1291 nm, 1311 nm, and 1331 nm, respectively. The optical transceiver 100 may also be capable of both short transmission distances of tens of meters, for example, to distances of 2 kilometers or more. The optical transceiver 100 may be used, for example, in internet data center applications or fiber to the home (FTTH) applications. In an embodiment, the optical transceiver 100 implements a Quad Small Form-Factor Pluggable (QSFP) transceiver. For example, the optical transceiver 100 may be implemented within a QSFP transceiver that comports with the QSFP28 specification as discussed above. The aspects and embodiments disclosed herein may be used within other transceiver types and is not necessarily limited to QSFP or QFSP+ transceivers. The optical transceiver 100 may be configured for dense wavelength division multiplexing (DWDM) or course wavelength division multiplexing (CWDM), depending on a desired configuration. Although aspects and scenarios disclosed herein discuss a four (4) channel configuration, other channel configurations, e.g., 2, 4, 8, 16, 32, and so on, are within the scope of this disclosure.

As shown, the optical transceiver 100 includes a transceiver housing 102 that may include a multi-channel TOSA arrangement 110 for transmitting optical signals on different channel wavelengths, and a multi-channel ROSA 112 for receiving optical signals on different channel wavelengths within a single transceiver housing, as will be discussed further herein. A transmit connecting circuit 104 and a receive connecting circuit 108 provide electrical connections to the multi-channel TOSA arrangement 110 and the multi-channel ROSA arrangement 112, respectively, within the transceiver housing 102. The transmit connecting circuit 104 and the receive connecting circuit 108 may communicate with external systems via data bus 103. In some cases, data bus 103 is a 38-pin connector that comports with physical connector QSFP standards and data communication protocols.

In any event, the transmit connecting circuit 104 electrically couples to the electronic components in the multi-channel TOSA arrangement 110, e.g., laser assemblies, and the receive connecting circuit 108 electrically couples to the electronic components in the multi-channel ROSA 112, e.g., an arrayed waveguide grating (AWG), detectors, amplification circuitry and so on. The transmit connecting circuit 104 and the receive connecting circuit 108 include at least conductive paths to provide electrical connections, and may also include additional circuitry such as clock and data recovery circuitry. The multi-channel TOSA arrangement 110 transmits and multiplexes multiple different channel wavelengths, and is coupled to an optical interface port 114. The optical interface port 114 may include an LC connector port, although other connector types are also within the scope of this disclosure.

In cases where the optical interface port 114 comprises a duplex, or bi-directional, LC receptacle, the LC connector receptacle provides optical connections to the multi-channel TOSA arrangement 110, and provides optical connections to the multi-channel ROSA 112. The LC connector receptacle may be configured to receive and be coupled to a mating LC connector 116 such that transmit optical fiber 122 of the external fibers 124 optically couples to the multi-channel arrangement TOSA 110, and the receive optical fiber 117 of the external fibers 124 optically couples to the multi-channel ROSA 112.

The multi-channel TOSA arrangement 110 can include multiple laser packages and optics for producing associated channel wavelengths, and can couple the same into the transmit optical fiber 122. In particular, the lasers in the multi-channel TOSA arrangement 110 can convert electrical data signals (TX_D1 to TX_D4) received via the transmit connecting circuit 104 into modulated optical signals transmitted over transmit optical fiber 122. The lasers may include, for example, distributed feedback (DFB) lasers with diffraction gratings. In other cases, the lasers may comprise electro-absorption modulated laser (EML) laser diode packages. The multi-channel TOSA arrangement 110 may also include monitor photodiodes for monitoring the light emitted by the lasers. The multi-channel TOSA arrangement 110 may further include one or more temperature control devices, such as a resistive heater and/or a thermoelectric cooler (TEC), for controlling a temperature of the lasers, for example, to control or stabilize the laser wavelengths.

The multi-channel ROSA 112 can include demultiplexing optics such as an AWG device and a plurality of detectors such as photodiode packages configured to receive de-multiplexed channel wavelengths. The ROSA 112 can use the detectors and associated circuitry (e.g., a TIA) to detect, amplify, and convert de-multiplexed channel wavelengths and can provide the same as electrical data signals, e.g., RX_D1 to RX_D4.

Example Optical Transceiver Module Having a Partitioned Housing

Figure 2A:
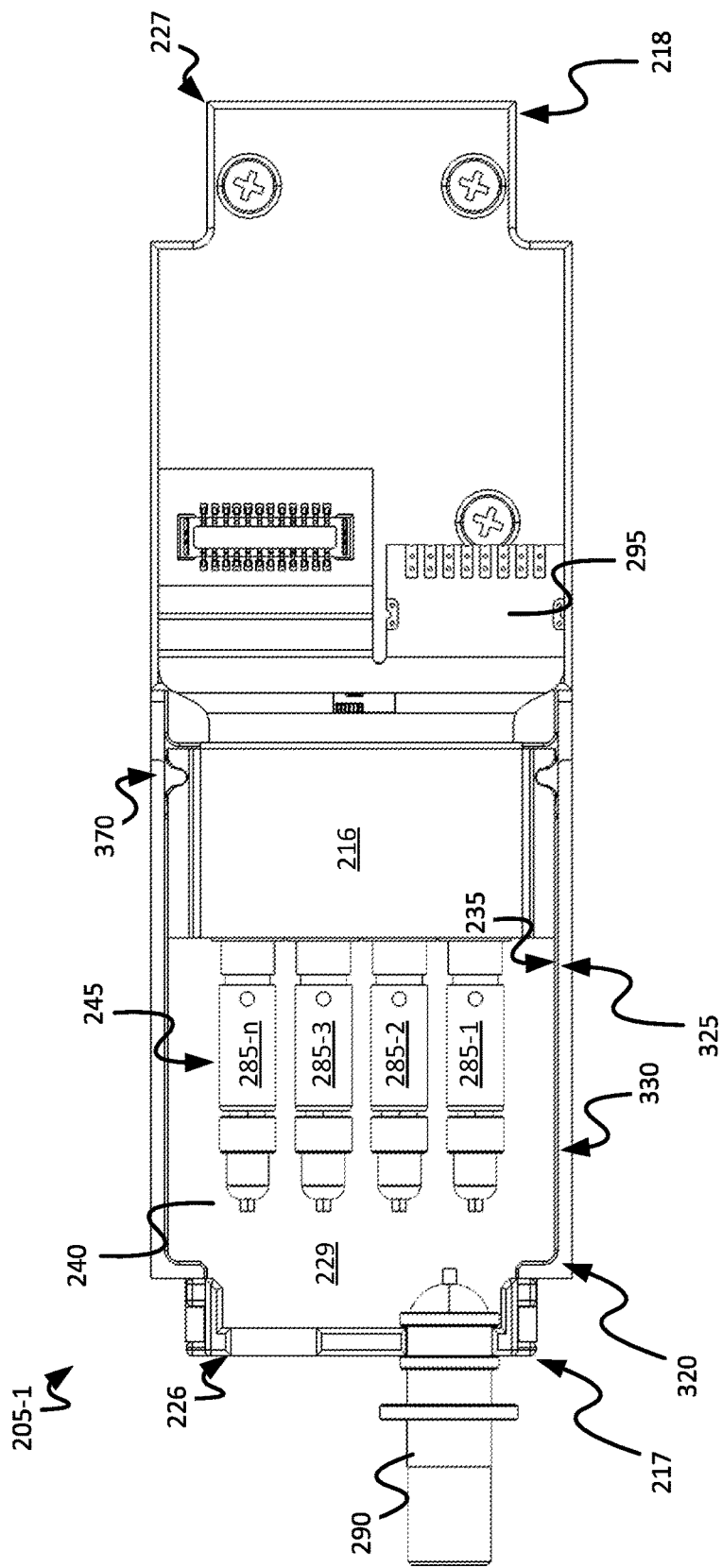
FIG. 2A is a top plan view of a first portion of an optical transceiver module housing configured to couple to a transmitter optical subassembly (TOSA) arrangement, in accordance with an embodiment of the present disclosure.
Figure 2B:
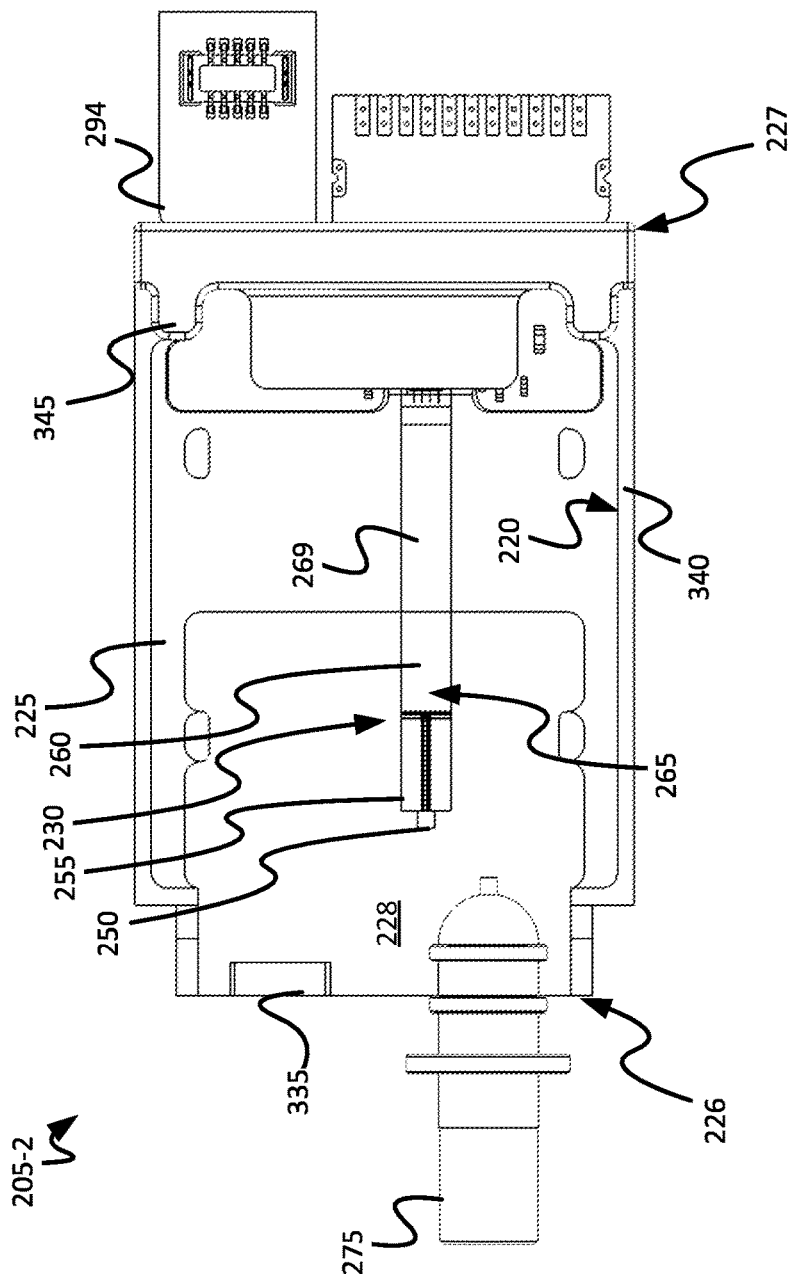
FIG. 2B is a top plan view of a second portion of an optical transceiver module housing configured to couple to a receiver optical subassembly (ROSA) arrangement, in accordance with an embodiment of the present disclosure.

Now turning to FIGS. 2A and 2B, first and second portions 205-1 and 205-2 of an optical transceiver module housing 205 (FIG. 3B) are shown in accordance with an embodiment of the present disclosure. An example assembled optical transceiver module 400 having both the first and second portions 205-1 and 205-2 coupled together is shown and described in greater detail below with reference to FIG. 3B. Each of the first and second portions 205-1 and 205-2 will now be discussed in turn.

FIG. 2A shows a top plan view of a first portion 205-1 of an optical transceiver module housing 205 configured to couple to a transmitter optical subassembly (TOSA) arrangement, in accordance with an embodiment of the present disclosure. The first portion 205-1 may also be accurately referred to as a TOSA housing portion 205-1. As shown, the TOSA housing portion 205-1 may include at least one sidewall 330 extending outwardly from a base 229 such that the base 229 and an interior surface 235 of the at least one sidewall 330 define a first compartment (or cavity) 240. The at least one sidewall 330 may extend from the first end 217 to the second end 218 of the ROSA housing portion 205-2. The first compartment 240 includes a TOSA arrangement 245 coupled to an interior surface the base 229 and/or the interior surface 235. The TOSA arrangement 245 may extend longitudinally within the first compartment 240. Additional aspects of the TOSA arrangement 245 are shown in greater detail in FIG. 4, which illustrates the TOSA housing portion 205-1 without the shield member 216 attached.

As further shown in FIG. 2A, the TOSA housing portion 205-1 of the housing 205 includes the TOSA 245 arrangement coupled thereto. The TOSA arrangement 245 may be coupled to the TOSA housing portion 205-1 via, for example, screws, adhesive, friction fit, tape, welds, or by any other suitable approach. The TOSA arrangement 245 may include one or more laser packages 285-1 to 285-N configured to emit associated channel wavelengths. Each of the laser packages 285-1 to 285-N may be configured to generate an associated channel wavelength. The laser packages 285-1 to 285-N may include any suitable laser device, such as a DFB laser, as previously discussed.

Each of the laser packages 285-1 to 285-N may optically couple to the optical interface port 290 by way of an intermediate fiber or suitable waveguide device (not shown). Each of the laser packages 285-1 to 285-N may also electrically couple to a flexible printed circuit (FPC) 295 for power and signaling/driving purposes. The FPC 295 carries an electrical driving signal and/or power for each of the laser packages 285-1 to 285-N. In some cases, the FPC 295 may also be coupled to the TOSA housing portion 205-1 in a manner similar to components of the TOSA arrangement 245 discussed above, which will not be repeated for brevity. However, the FPC 295 may also be simply coupled to the TOSA arrangement 245, e.g., via wire bonding, without necessarily being also coupled to surfaces of the TOSA housing portion 205-1. In any event, the first compartment 240 may be configured to receive the TOSA arrangement 245 and associated circuitry, and therefore, may generally be described as being a TOSA compartment 240.

Turning to FIG. 2B, a top plan view of the second portion 205-2 of an optical transceiver module housing 205 is shown and may be configured to receive and couple to a receiver optical subassembly (ROSA) arrangement, in accordance with an embodiment of the present disclosure. As shown, the ROSA housing portion 205-2 may include at least one sidewall 340 extending outwardly from a base 228 such that the base 228 and an interior surface 220 of the at least one sidewall 340 define a second compartment (or cavity) 225. The at least one sidewall 340 may extend from the first end 226 to the second end 227 of the ROSA housing portion 205-2. The ROSA arrangement 230 may be coupled to the base 228 and/or the interior surface 220 of the second compartment 225 of the housing 205. As such, the first compartment 225 may be configured to receive the ROSA arrangement 230 and may be generally described as a ROSA compartment 230. In an embodiment, the first and second compartments 240 and 225 advantageously provide a substantially equal amount of total surface area, or total mounting surface area, for attachment of associated optical component assemblies, optical fiber(s), associated circuitry including FPCs 294 and 295, and so on. Further, the first and second compartments 240 and 225 may advantageously include a substantially equal volume. Stated differently, the first and second compartments 240 and 225 may provide a substantially similar amount of internal workspace for coupling and alignment of associated components.

Figure 4:
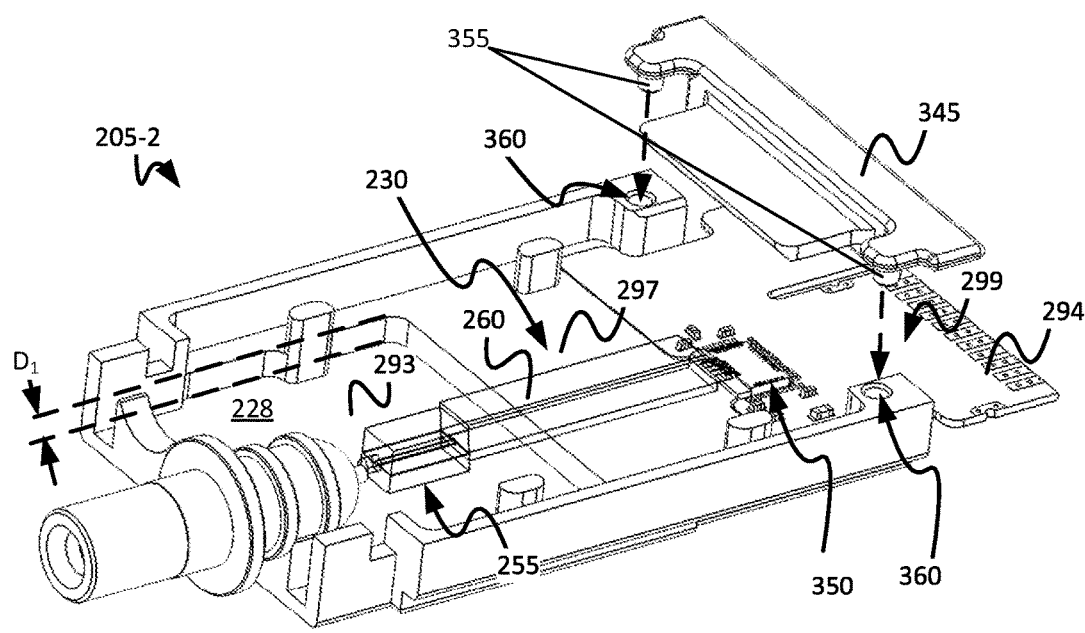
FIG. 4 shows a perspective view of a second portion of the optical transceiver module housing of FIG. 2B, in accordance with an embodiment of the present disclosure.

Continuing with FIG. 2B, the ROSA arrangement 230 includes an arrayed waveguide grating (AWG) device 260, with the AWG device 260 including an optical coupling port 250, an input coupling region 255, an AWG chip region 269, and an array of photodiodes and associated transimpedance amplifiers (TIAs) 350, which are shown more clearly in FIG. 4. An optical interface port 275, e.g., an LC connector port, may be coupled to the ROSA housing portion 205-2 at the first end 226 of the transceiver housing 205. The optical interface port 275 may be optically coupled to the optical coupling port 250 of the AWG device 260 by way of an intermediate fiber (not shown) or other suitable device such as a waveguide. The optical coupling port 250 of the AWG device 260 is optically coupled to the input coupling region 255. The input coupling region 255 may be optically coupled to a first end of the AWG device 260 in order to launch an optical signal into waveguide gratings of the AWG device 260. The AWG device 260 may be implemented in accordance with the AWG device disclosed in the co-pending U.S. application Ser. No. 15/137,823 titled "Techniques for Direct Optical Coupling of Photodetectors to Optical Demultiplexer Outputs and an Optical Transceiver Using the Same" filed on Apr. 25, 2016, the entirety of which is incorporated herein by reference.

Figure 3A:
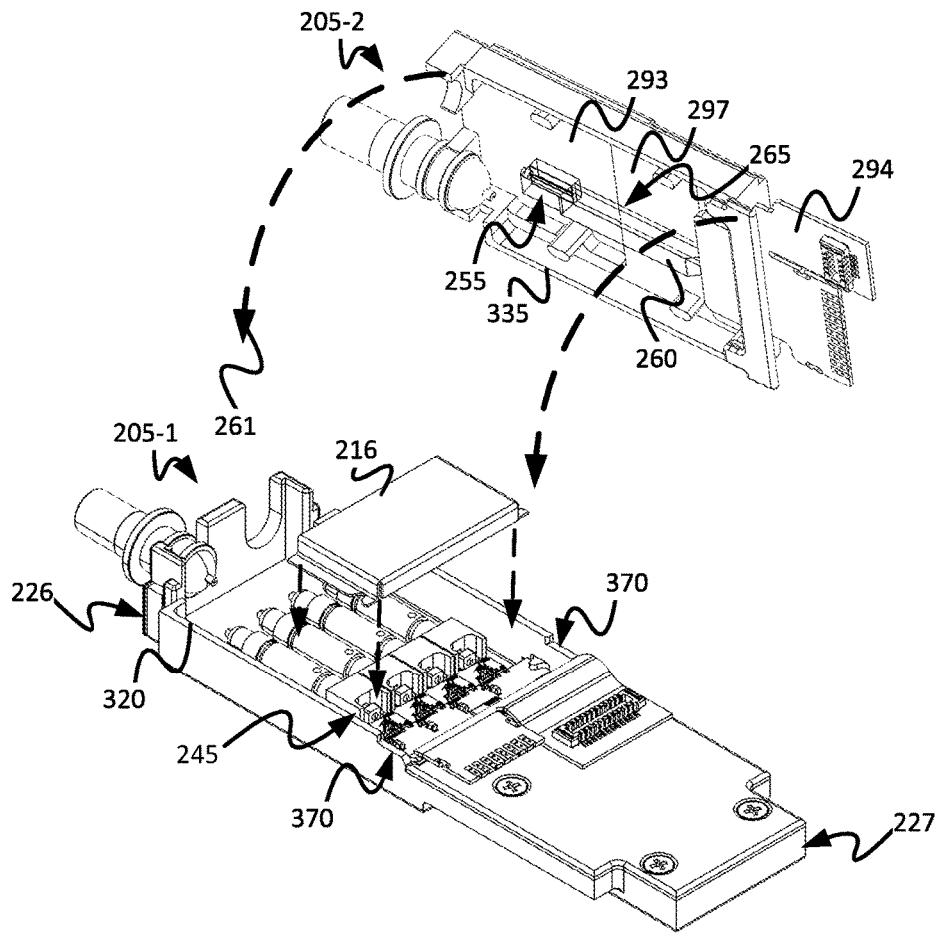
FIG. 3A shows a perspective view of the first and second portions of the optical transceiver module housing of FIGS. 2A and 2B, respectively, prior to coupling of the same to form an assembled optical transceiver module, in accordance with an embodiment of the present disclosure.

In some instances, such as shown in FIG. 2B, the input coupling region 255 is coupled to the AWG device 260 in an offset manner such that the input coupling region 255 protrudes beyond the surface 265 of the AWG chip region 269, which can be more clearly seen in FIGS. 3A and 4. In a practical sense, this may prevent the AWG device 260 from being disposed flat against the mounting surface 297 (FIG. 4) for coupling purposes. For example, as shown in FIG. 4 the ROSA housing portion 205-2 may include at least a first mounting surface 297 configured to couple to and support at least a portion of the AWG chip region 269 and/or associated circuitry, e.g., the photodiodes and TIAs 350. The ROSA housing portion 205-2 may further include a second mounting surface 293, with the second mounting surface 293 being offset/recessed relative to the first mounting surface 297. In some cases, the ROSA assembly 230 is directly coupled to a single mounting surface, e.g., mounting surface 297, without necessarily including a recessed mounting region.

Thus, and as shown in FIG. 4, the AWG device 260 may be disposed substantially flat on the first mounting surface 297 along at least a portion of its length with the second mounting surface 293 being recessed by an offset distance $D_1$ to receive (but not necessarily couple to) the optical input coupling region 255. The offset distance $D_1$ may equal about 1.5 mm, although other offset distances may be used to account for dimensional constraints imposed by other AWG/ROSA components depending on a desired configuration. In some cases, the offset distance $D_1$ may be uniform, e.g., continuous, or may be discontinuous.

Continuing on with FIG. 4, the AWG device 260 may be optically coupled to an array of photodiodes and associated TIAs 350 for the purposes of detecting, amplifying, and converting each of the channel wavelengths into an electrical signal. Each of the photodiodes and associated TIAs 350 may be electrically coupled to a flexible printed circuit (FPC) 294. The FPC 294 may be coupled to the base 228 of the ROSA housing portion 205-2. In some instances, the FPC 294 may be coupled to the ROSA housing portion 205-2 such that a surface 299 of the FPC 294 is substantially coplanar with at least one surface of the base 228, e.g., surface 297.

A shield 345 (or shield member 345) may be coupled to the ROSA housing portion 205-2 and may cover the array of photodiodes and associated TIAs 350. The shield 345 may include one or more protrusions 355 for coupling to corresponding openings 360 located adjacent an end of the ROSA housing portion 205-2. Once received within the corresponding opening 360, the protrusions may couple the shield 345 to the ROSA housing portion 205-2 by, for example, a friction fit or snap-fit. In some instances, an adhesive may be applied to the one or more protrusions 355 prior to coupling into the plurality of openings 360. Therefore, in some instances, the shield 345 may be coupled to the ROSA housing portion 205-2 using a combination of an adhesive and a friction fit or a snap-fit. In other instances, the shield 345 may not include the one or more protrusions 355 and may, for example, be coupled to the ROSA housing portion 205-2 using an adhesive, a mechanical coupling means, such as, a screw, combinations thereof, or any other method of attachment.

Turning to FIG. 3A, with additional reference to FIG. 4, the TOSA housing portion 205-1 may include a groove 370 for receiving at least a portion of the shield 345 such that when the ROSA housing portion 205-2 is coupled to the TOSA housing portion 205-1, the presence of gaps at an interface 405 (FIG. 3B) between the ROSA housing portion 205-2 and the TOSA housing portion 205-1 are minimized.

Continuing with FIG. 3A, the TOSA housing portion 205-1 of the housing 205 may include dimensions that generally correspond to ROSA housing portion 205-2 to allow for mating/coupling. For example, the TOSA housing portion 205-1 may also include one or more mating surfaces 320 defined by the sidewall 330 of the TOSA housing portion 205-1. The one or more mating surfaces 320 of the TOSA housing portion 205-1 may couple to one or more corresponding mating surfaces 335 of the ROSA housing portion 205-2. In some instances, a friction fit may be formed between the mating surface 320 of the TOSA housing portion 205-1 and the corresponding mating surface 335 of the ROSA housing portion 205-2. In other instances, the mating surface 320 of the TOSA housing portion 205-1 and the mating surface 325 of the ROSA housing portion 205-2 may collectively form a snap-fit. In still other cases the mating surface 335 of the TOSA housing portion 205-1 and the mating surface 335 of the ROSA housing portion 205-2 may simply be coupled together via adhesive, fastening members (e.g., screws, pins, and so on), friction fit, snap fit, or any combination thereof.

In any event, and in accordance with an embodiment, each of the TOSA and ROSA housing portions 205-1 and 205-2 may be independently assembled and also may be tested to ensure nominal performance separate from each other. Thus each of the TOSA and ROSA housing portions 205-1 and 205-2 may be assembled in parallel, e.g., at about the same time, or may be assembled at different times. Therefore, each of the TOSA and ROSA housing portions 205-1 and 205-2 may be disposed flat on a work surface, such as a workbench or other such fixture, to provide a relatively simplified work surface to perform attachment of optical subassembly components and associated circuitry, cabling, fiber routing, and so on. This advantageously minimizes or otherwise reduces incidences of component damage and the necessity of rework iterations that characterize other approaches to optical transceiver modules that attempt to couple and optically align both TOSA and ROSA arrangements in a single housing portion. Accordingly, a finalization stage of an assembly process may then include "flipping" over the ROSA housing portion 205-2 onto the TOSA housing portion 205-1 as shown by directional arrows 261 after each respective component includes requisite components, circuitry, intermediate fibers and so on. The finalization stage may also include coupling shield 216 to the TOSA housing portion 205-1 prior to such flip-over coupling of the ROSA housing portion 205-2. In a general sense, the ROSA housing portion 205-2 then becomes the cover for the assembled optical transceiver module 400. As the ROSA arrangement 230 and associated components are coupled to what essentially becomes a cover portion, the ROSA arrangement 230 may be referred to as a having a flip-over configuration as the same is disposed upside down relative to the TOSA arrangement 245 coupled to the TOSA housing portion 205-1. An assembly process in accordance with the aspects and scenarios disclosed herein may include manual stages, e.g., performed by one or more technicians, automated stages, e.g., by pick-and-place machines and other robotics, or any combination thereof.

Figure 3B:
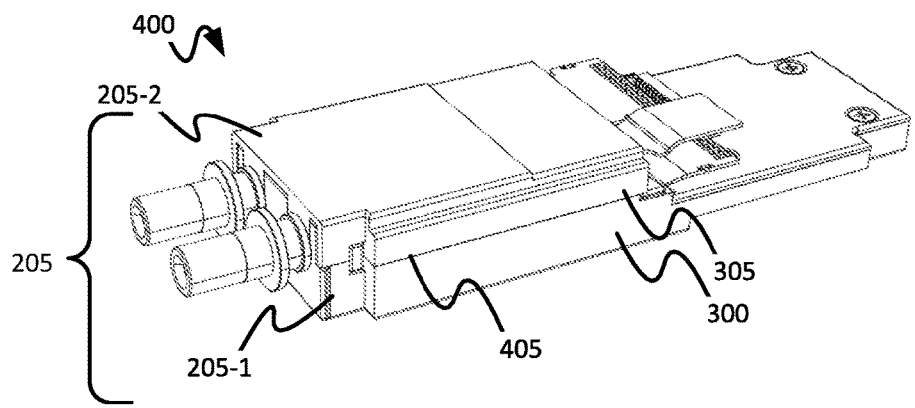
FIG. 3B shows a perspective view of an assembled optical transceiver module, in accordance with an embodiment of the present disclosure.

Turning to FIG. 3B, an optical transceiver module 400 is shown after a finalization stage couples the TOSA housing portion 205-1 to the ROSA housing portion 205-2, in accordance with an embodiment of the present disclosure. Post finalization, that is to say when the TOSA housing portion 205-1 is coupled to the ROSA housing portion 205-2, an external surface 300 of the TOSA housing portion 205-1 may be substantially coplanar with an external surface 305 of the ROSA housing portion 205-2. As shown, at least a portion of the ROSA arrangement 230 (FIG. 2) is disposed in a manner opposing the TOSA arrangement 245, with each of the ROSA arrangement 230 and TOSA arrangement 245 extending towards an interface 405 between respective housing portions.

The interface 405 may circumscribe the housing 205 at a location generally corresponding to where the ROSA housing portion 205-2 mates with the TOSA housing portion 205-1. The ROSA housing portion 205-2 may be coupled to the TOSA housing portion 205-1 using, for example, friction-fits, adhesives, mechanical couplers, such as, screws or snap fits, combinations thereof, and other like methods of attachment. The interface 405 may include one or more gaps and/or openings resulting from, for example, manufacturing tolerances. These gaps and/or openings may allow contaminants to enter the housing 205. To prevent, mitigate, and/or otherwise reduce the ingress of contaminants into the transceiver housing 205, a sealant and/or interstitial filler may be applied to the interface 405. The sealant may or may not have adhesive properties. In some instances, there may be more than one interface 405. In these situations, a sealant and/or interstitial filler may be applied to each of the interfaces 405.

Figure 5:
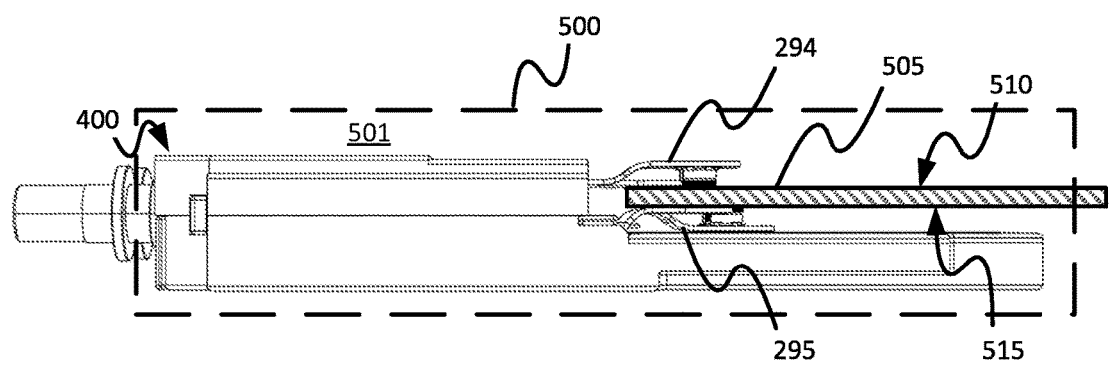
FIG. 5 is a side plan view of the assembled optical transceiver module of FIG. 3B having a printed circuit board (PCB) assembly coupled thereto, in accordance with an embodiment of the present disclosure.

Turning to FIG. 5, the finalization stage may also include coupling a printed circuit board assembly (PCBA) 505 to each of the FPCs 294 and 295. The FPC 294 that corresponds to the ROSA arrangement 230 (FIG. 2B) may be electrically coupled to a ROSA facing surface 510 of the PCBA 505. The ROSA facing surface 510 is opposite a TOSA facing surface 515 of the PCBA 505. The TOSA facing surface 515 may be electrically coupled to the FPC 295 that corresponds to the TOSA arrangement 245 (FIG. 2A). In other words, the PCBA 505 may be disposed between each of the FPCs 294 and 295 such that the surface of the PCBA 505 that is proximal to the ROSA arrangement 230 relative to the TOSA arrangement 245 is electrically coupled to the FPC 294 that corresponds to the ROSA arrangement 230, and on the other hand, the surface of the PCBA 505 that is proximal to the TOSA arrangement 245 relative to the ROSA arrangement 230 is electrically coupled to the FPC 295 that corresponds to the TOSA arrangement 245. However, this example configuration is not intended to limit the present disclosure and other embodiments are within the scope of this disclosure.

In an embodiment, a secondary housing 500, such as a QSFP housing or other SFF housing, may optionally enclose at least a portion of assembled optical transceiver module 400 and at least a portion of the PCBA 505 within a cavity 501 defined by the secondary housing. The secondary housing may further be referred to as a host housing 500. Therefore, in some instances, a portion of the PCBA 505 extends outside of the secondary housing 500. The portion of the PCBA 505 that extends beyond the secondary housing 500 may electrically couple to an external device such as a pluggable receptacle for receiving and electrically coupling to a QSFP optical transceiver.

While the present disclosure generally illustrates the housing 205 as being a two-portion, or bi-furcated, transceiver module housing, the transceiver housing 205 is not necessarily limited in this regard. In some instances, the housing 205 may include at least three separable portions. In some cases, the housing 205 may include a clam shell or hinged configuration whereby the TOSA and ROSA housing portions 205-1 and 205-2 are coupled via a hinge or other similar device along interface 405 (FIG. 3B).

Figure 6:
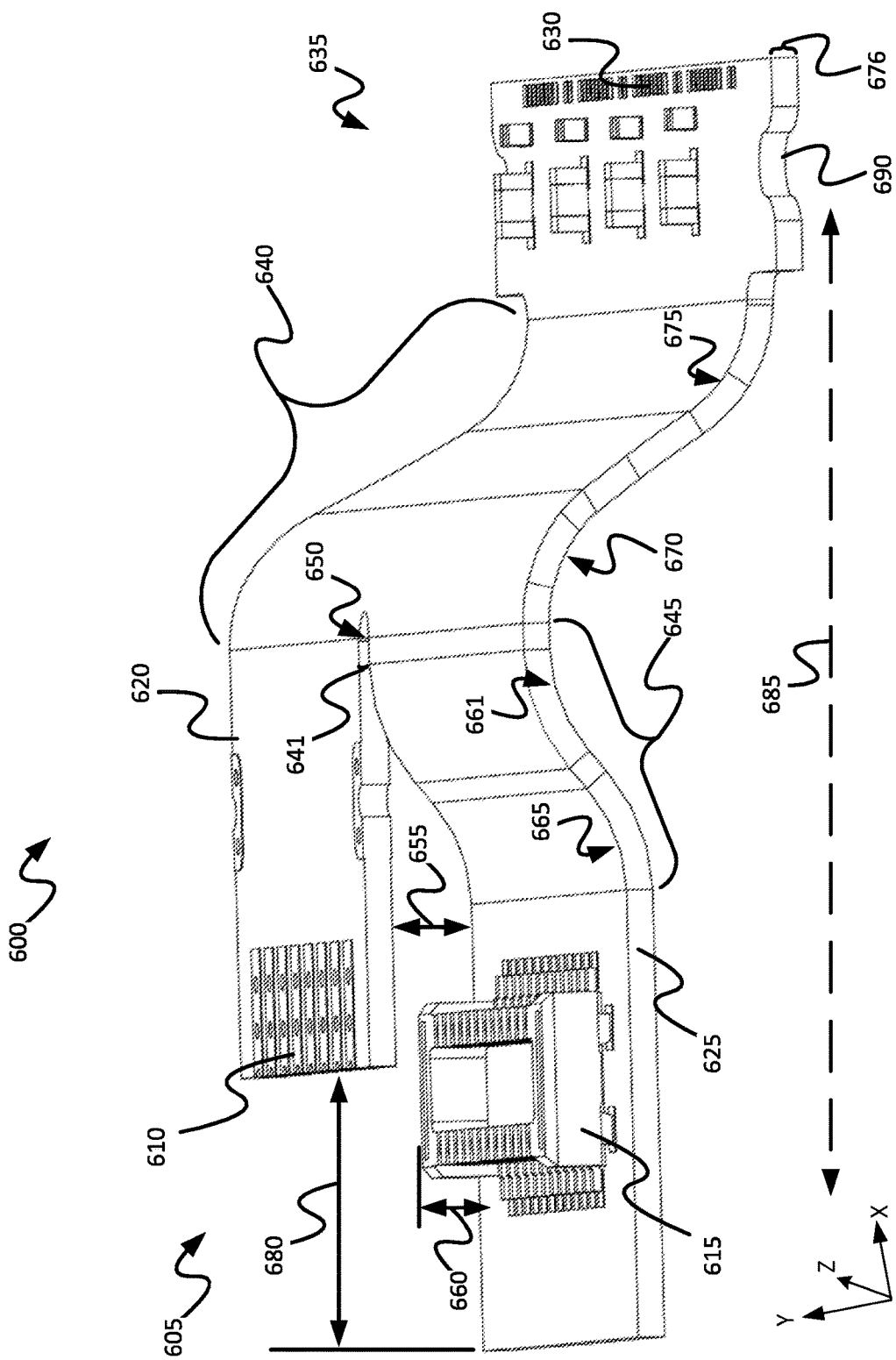
FIG. 6 is a perspective view of a flexible printed circuit (FPC) capable of being used to provide power and radio frequency (RF) signals to the TOSA arrangement of FIG. 2A, in accordance with an embodiment of the present disclosure.

Turning now to FIG. 6, an example of a flexible printed circuit (FPC) 600 is shown. The FPC 600 may be suitable for use as the FPC 295 of the TOSA arrangement 245 (FIG. 2A). As shown, a system coupling end 605 of the FPC 600 includes conductive pads 610 and a pluggable controller socket 615. The conductive pads 610 may electrically couple to a transmit connecting circuit, e.g., transmit connecting circuit 104, to provide RF signals for purposes of driving associated laser devices, e.g., the laser packages 285-1 to 285-N.

As further shown, the conductive pads 610 are disposed on a first arm 620 or first portion 620 of the FPC 600 and the pluggable controller socket 615 is provided on a second arm 625 or second portion 625 of the FPC 600. The first and second portions 620 and 625 may be separated by an offset distance 655, which is discussed in more detail further below. The conductive pads 610 and the pluggable connector 615 are electrically connected to transmit conductive pads 630 at a transmit end 635 of the FPC 600. The transmit conductive pads 630 can be used to electrically couple the FPC 600 to, for example, the TOSA arrangement 245 of FIG. 2A. For example, each of the laser assemblies of the TOSA arrangement 245 may be wire bonded to associated transmit conductive pads 630.

The FPC 600 may include a first flexible region 640 extending between the transmit end 635 of the FPC 600 and the first arm 620. The transmit end 635 and the first arm 620 may be more rigid than the first flexible region 640, at least at those locations having the conductive pads 610, 630. For example, the rigidity of the first arm 620 and the transmit end 635, at least at the locations having conductive pads 610, 630, may be increased using a stiffener such as, but not limited to, an epoxy glass laminate or a polyimide film. Additionally, or alternatively, the locations having the conductive pads 610, 630 may be formed of a rigid circuit board electrically coupled to the first flexible region 640. In other words, a hybrid circuit board assembly having both rigid and flexible regions may be formed.

The FPC 600 may also include a second flexible region 645 extending between the first flexible region 640 and the second arm 625. The second arm 625 may also be more rigid than the second flexible region 645, at least at those locations having the pluggable connector 615. For example, the rigidity of the transmit end 635 may be increased, at least at those locations including the pluggable connector 615, using a stiffener such as, but not limited to, an epoxy glass laminate or a polyimide film. Additionally, or alternatively, the locations having the pluggable connector 615 may be formed of a rigid circuit board electrically coupled to the second flexible region 645. In other words, a hybrid circuit board assembly having both rigid and flexible regions may be formed. The FPC 600 may include a curvilinear shape/profile defined by the first and second flexible regions 640 and 645. The curvilinear shape may also be accurately described as an arcuate region.

As shown, the second arm 625 and the second flexible region 645 may be separated from the first arm 620 by a gap 650 or offset 650 extending parallel to a longitudinal axis 685 for at least a portion of the longitudinal length of the FPC 600. As shown, the gap 650 increases along the Y axis while remaining at a substantially constant distance, e.g., width 641, along the X axis. Thus, a width 641 of the gap 650 may be substantially constant. In other instances, the width 641 of the gap 650 may be non-constant. For example, the width 641 of the gap 650 may increase and/or decrease linearly, exponentially, logarithmically, and/or irregularly (e.g., the width 641 both increases and decreases).

The gap 650 allows the second arm 625 to be displaced relative to the first arm 620 by introducing at least one bend into the second flexible region 645. For example, the second flexible region 645 may be bent such that the second arm 625 is displaced from the first arm 620 by a separation distance 655 or offset 655. In some embodiments, the separation distance 655 may be equal to or greater than a height 660 of the pluggable connector socket 615. In other cases, the separation distance 655 is less than height 660.

In some instances, the second flexible region 645 may be bent to include a first curvature 661 (or arcuate region 661) and a second curvature 665 (or arcuate region 665). The concavity of the first curvature 661 may be opposite the concavity of the second curvature 665 such that an "S" shape is generally formed. A radius of the first curvature 661 may be substantially equal to a radius of the second curvature 665, or may be different. Each radius may be defined, at least in part, by the flexibility of the second flexible region 645. In other words, as the flexibility of the second flexible region 645 decreases, the radius of the first and second curvatures 661, 665 may increase to prevent the second flexible region 645 from fracturing. For example, a tensile modulus of the second flexible region 645 may be within the range of 480 MPa and 3400 MPa. In some embodiments, the radius of the first and/or second curvatures 661, 665 may be at least ten times greater than a thickness 676 of the FPC 600.

As shown, the inclusion of the second flexible region 645 results in the second arm 625 extending beyond the first arm 620 by an extension distance 680. The first flexible region 640 may also be bent to include a first curvature 670 and a second curvature 675. The concavity of the first curvature 670 may be opposite the concavity of the second curvature 665 such that an "S" shape is generally formed. A radius of the first curvature 670 may be substantially equal to a radius of the second curvature 675, or may be different. Each radius may be defined, at least in part, by the flexibility of the first flexible region 640. In other words, as the flexibility of the first flexible region 640 decreases, the radius of the first and second curvatures 670 and 675 may increase to prevent the first flexible region 640 from fracturing. For example, a tensile modulus of the first flexible region 640 may be within the range of 480 MPa and 3400 MPa. In some embodiments, the radius of the first and/or second curvatures 670, 675 may be at least ten times greater than the thickness 676 of the FPC 600.

As shown, the transmit end 635 of the FPC 600 includes one or more retention features 690. The retention features 690 may engage a portion of the TOSA housing portion 205-1 (FIG. 2A) such that movement of the FPC 600 parallel to the longitudinal axis 685 is prevented, reduced, or otherwise mitigated. By reducing/preventing movement parallel to the longitudinal axis 685, the forces exerted on the wire bonds connecting the TOSA arrangements 245 to the FPC 600 may be prevented, reduced, or otherwise mitigated.

As shown, the conductive pads 630 are disposed at an end of the transmit end 635 of the FPC 600. The conductive pads 630 may provide both RF and DC signals to laser assemblies adjacent the FPC. Therefore, the conductive pads 630 and associated laser assemblies may be coupled directly, wherein the direct connection includes a straight interconnection, e.g., wire bonding, that does not require an intermediate device. Moreover, the direct connection may include a distance of 1 mm or less between the conductive pads 630 and pads/terminals of associated laser packages.

Figure 7:
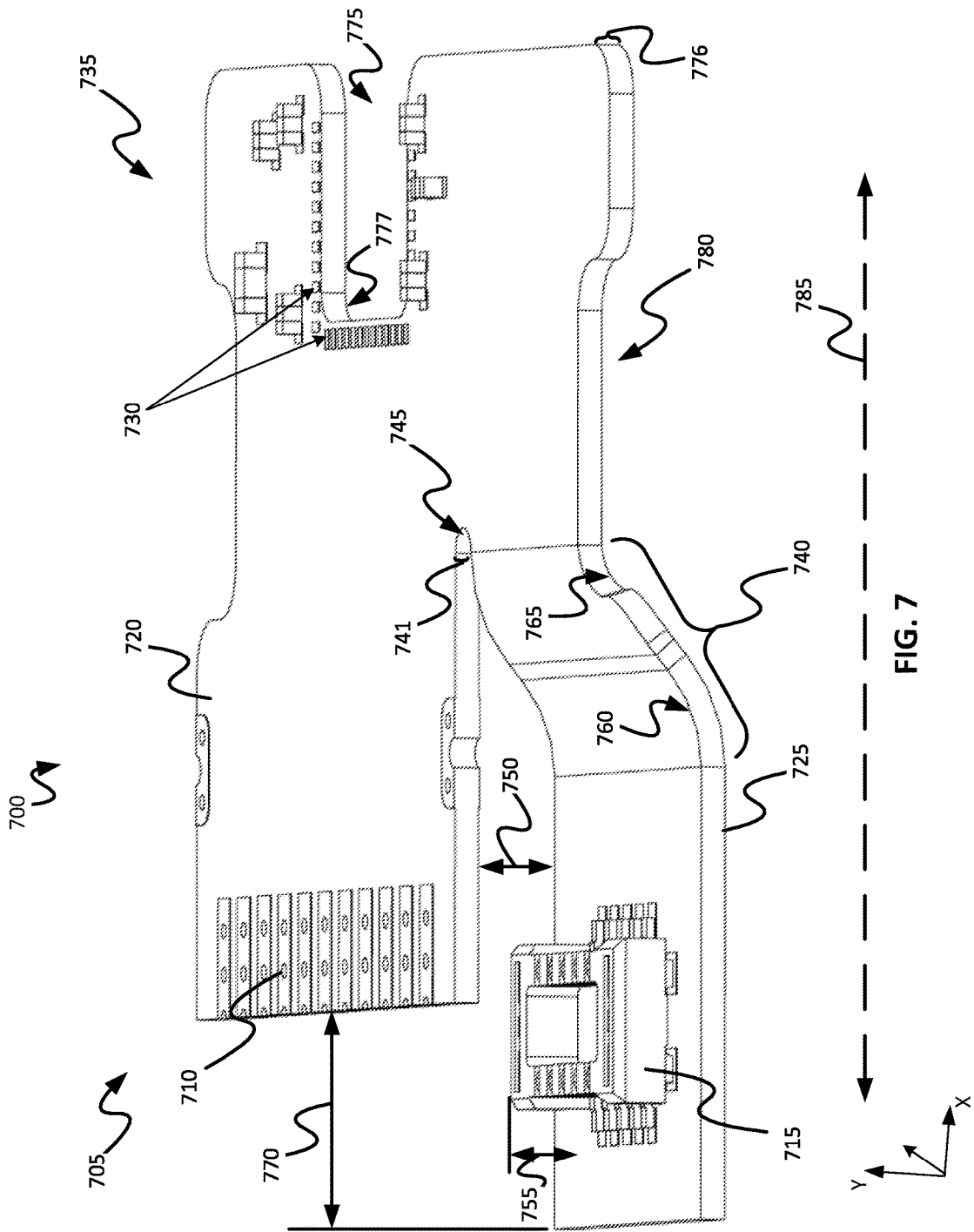
FIG. 7 is a perspective view of a FPC capable of being used with the ROSA arrangement of FIG. 2B, in accordance with an embodiment of the present disclosure.

Turning now to FIG. 7, an example of a flexible printed circuit board (FPC) 700 is shown. The FPC 700 may be suitable for use as the FPC 294 of the ROSA arrangement 230 (FIG. 2B). As shown, a system coupling end 705 of the FPC 700 includes conductive pads 710 and a pluggable connector 715. The system coupling end 705 may electrically couple to the receive connecting circuit 108. The conductive pads 710 are included on a first arm 720 of the FPC 700 and the pluggable connector 715 is provided on a second arm 725 of the FPC 700. The transmit conductive pads 710 and the pluggable connector 715 are electrically connected to receive conductive pads 730 at an end 735 or ROSA end 735 of the FPC 700. The receive conductive pads 730 can be used to electrically couple the FPC 700 to, for example, the ROSA arrangement 230 of FIG. 2B.

The FPC 700 includes a flexible region 740 extending between the receive end 735 and the second arm 725. The first arm 720, the second arm 725, and the ROSA end 735 may be more rigid than the flexible region 740, at least at those locations having conductive pads 710, 730 and the pluggable connector 715. For example, the rigidity of the first arm 720, second arm 725, and/or the ROSA end 735 may be increased using a stiffener such as, but not limited to, an epoxy glass laminate or a polyimide film. Additionally, or alternatively, the locations having conductive pads 710, 730 and the pluggable connector 715 may be formed of a rigid circuit board electrically coupled to the flexible region 740. In other words, a hybrid circuit board assembly having both rigid and flexible regions may be formed.

As shown, the flexible region 740 and the second arm 725 may be separated from the first arm 720 by a gap 745 extending parallel to a longitudinal axis 785 for at least a portion of the longitudinal length of the FPC 700. As shown, the gap 750 increases along the Y axis while remaining at a substantially constant distance, e.g., width 741, along the X axis. Thus, a width 741 of the gap 750 may be substantially constant. In other instances, the width 741 of the gap 745 may be non-constant. For example, the width 741 of the gap 745 may increase and/or decrease linearly, exponentially, logarithmically, and/or irregularly (e.g., the width 741 both increases and decreases).

The gap 745 allows the second arm 725 to be displaced relative to the first arm 720 by bending the flexible region 740. For example, the flexible region 740 may be bent such that the second arm 725 is displaced from the first arm 720 by a separation distance 750. In some embodiments, the separation distance 750 may be equal to or greater than a height 755 of the pluggable connector 715. In other cases, the separation distance 750 is less than height 750.

In some instances, the flexible region 740 may be bent to include a first curvature 760 and a second curvature 765. The concavity of the first curvature 760 may be opposite the concavity of the second curvature 765 such that an "S" shape is generally formed. A radius of the first curvature 760 may be substantially equal to a radius of the second curvature 765. Each radius may be defined, at least in part, by the flexibility of the flexible region 740. In other words, as the flexibility of the flexible region 740 decreases, the radius of the first and second curvatures 760 and 765 may increase to prevent the flexible region 740 from fracturing. For example, a tensile modulus of the flexible region 740 may be within the range of 480 MPa and 3400 MPa. In some embodiments, the radius of the first and/or second curvatures 760, 765 may be at least ten times greater than a thickness 776 of the FPC 700.

As shown, the inclusion of the flexible region 740 results in the second arm 725 extending beyond the first arm 720 by an extension distance 770. As also shown, the ROSA end 735 of the FPC 700 includes a cut-out 775, which may also be referred to as a notch or opening. The receive conductive pads 730 may be positioned around a perimeter of the cut-out 775. When the FPC 700 is positioned, for example, within the ROSA portion 205-2 (FIG. 2B), the array of photodiodes and associated TIAs 350 (FIG. 4) may be positioned within the cut-out 775 such that the array of photodiodes and associated TIAs 350 may be wire bonded to the FPC 700. In some cases, this includes direct coupling, e.g., of about 1 mm or less, between associated TIAs 350 and the conductive pads 730. In some embodiments, at least a portion of, for example, the AWG chip region 269, (FIG. 2B) may also be positioned within the cut-out 775. The inclusion of the cut-out 775 may also increase the workspace within the ROSA housing portion 205-2 for routing one or more optical fibers optically coupling the ROSA arrangement 230 to the optical interface port 275 (FIG. 2B). The FPC 700 may include a curvilinear shape/profile defined by the first and second flexible regions 740 and 745. The curvilinear shape may also be accurately described as an arcuate region.

As shown, the cut-out 775 may have a generally rectangular shape. In some instances, a rectangular cut-out 775 may include one or more chamfers and/or fillets 777 at, for example, one or more stress concentration points. In other embodiments, the cut-out 775 may have any combination of a circular shape, a triangular shape, a trapezoidal shape, a pentagonal shape, a hexagonal shape, or any other suitable shape.

The ROSA end 735 of the FPC 700 may also include one or more retention features 780. The retention feature 780 may engage a portion of the ROSA housing portion 205-1 such that movement of the FPC 700 parallel to the longitudinal axis 785 is prevented. By reducing/preventing movement parallel to the longitudinal axis 785, the forces exerted on the wire bonds connecting the array of photodiodes and associated TIAs 350 with the FPC 700 may be minimized or otherwise prevented.

Figure 8A:
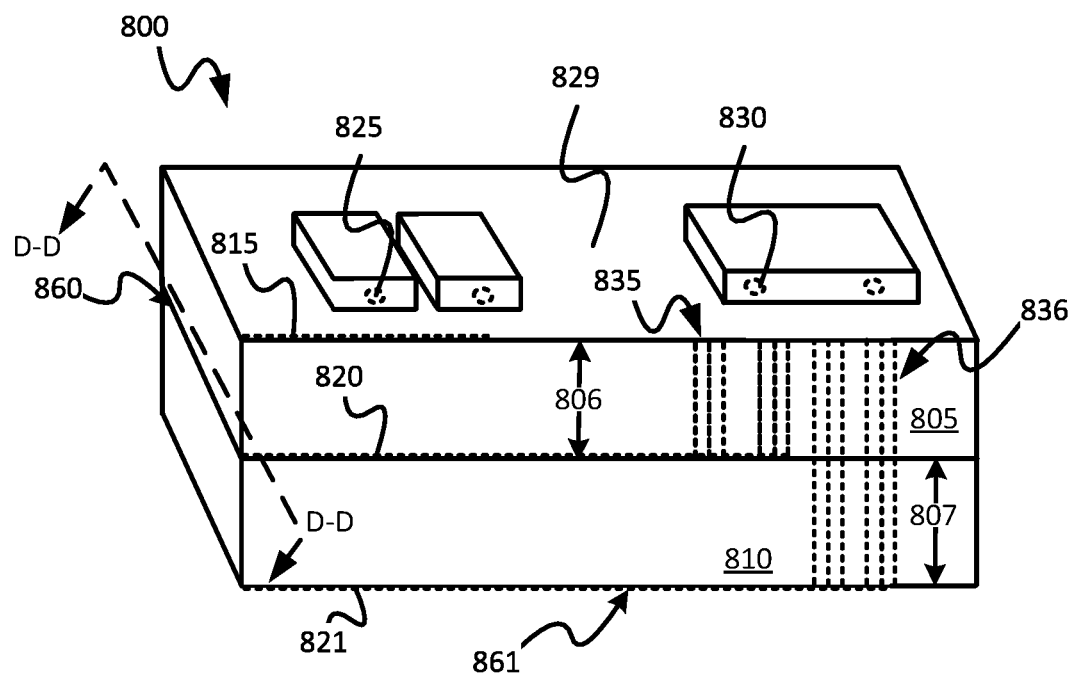
FIG. 8A is an example cross-sectional view of a FPC configured to provide both power and RF signal lines in accordance with an embodiment of the present disclosure.
Figure 8B:
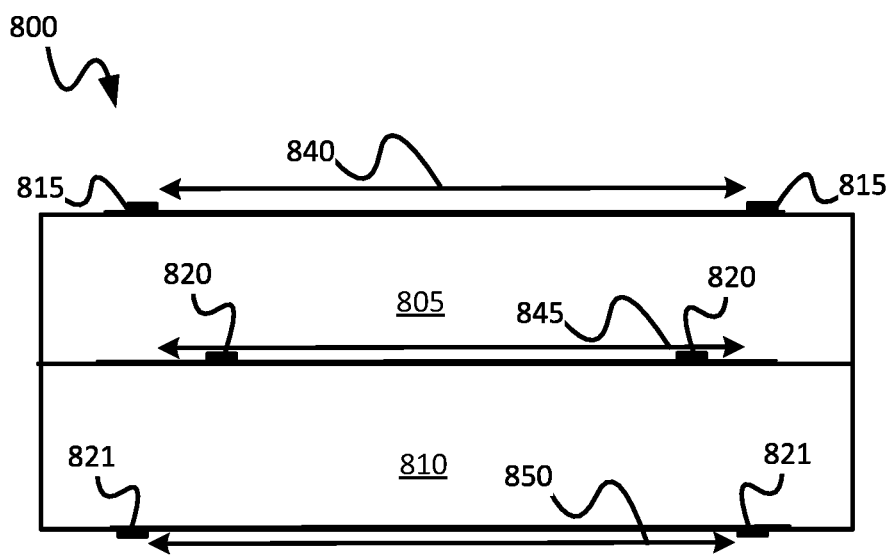
FIG. 8B is an example cross-sectional view of the FPC of FIG. 8A taken along the line D-D.

The FPC 600 and the FPC 700 may be multilayered flexible printed circuits as variously disclosed herein. FIGS. 8A and 8B show a simplified example of a multilayered FPC 800 to illustrate how a FPC 600 and/or the FPC 700 can include multiple signal carrying layers. As shown, the FPC 800 includes at least a first insulating layer 805 and a second insulating layer 810. The first insulating layer 805 is disposed directly, as shown, on a first surface 860 of the second insulating layer 810.

The first and second insulating layer 805 and 810 may be arranged in a stack, such as shown. However, other embodiments are within the scope of this disclosure. For example, the FPC 800 may include N number of layers and is not necessarily limited to two insulating layers as shown. For example, as shown in FIGS. 8A and 8B the FPC 800A may include three insulating layers. Further, the FPC 800 may include one or more intermediate layers between one or more of the first, second and third insulating layers 805, 810, and 812. In any event, each insulation layer may comprise a same or different material. The insulating material may comprise, for example, a dialectical material or other suitable material.

In one non-limiting example embodiment, the first insulating layer 805 may have a thickness 806 that measures in the range of 1 to 3 mil. The second insulating layer 810 may have a thickness 807 that measures in the range of 1 to 3 mil. Each of the first and second insulating layers 805 and 810 may have the same thickness or different thicknesses depending on a desired configuration.

Figure 8C:
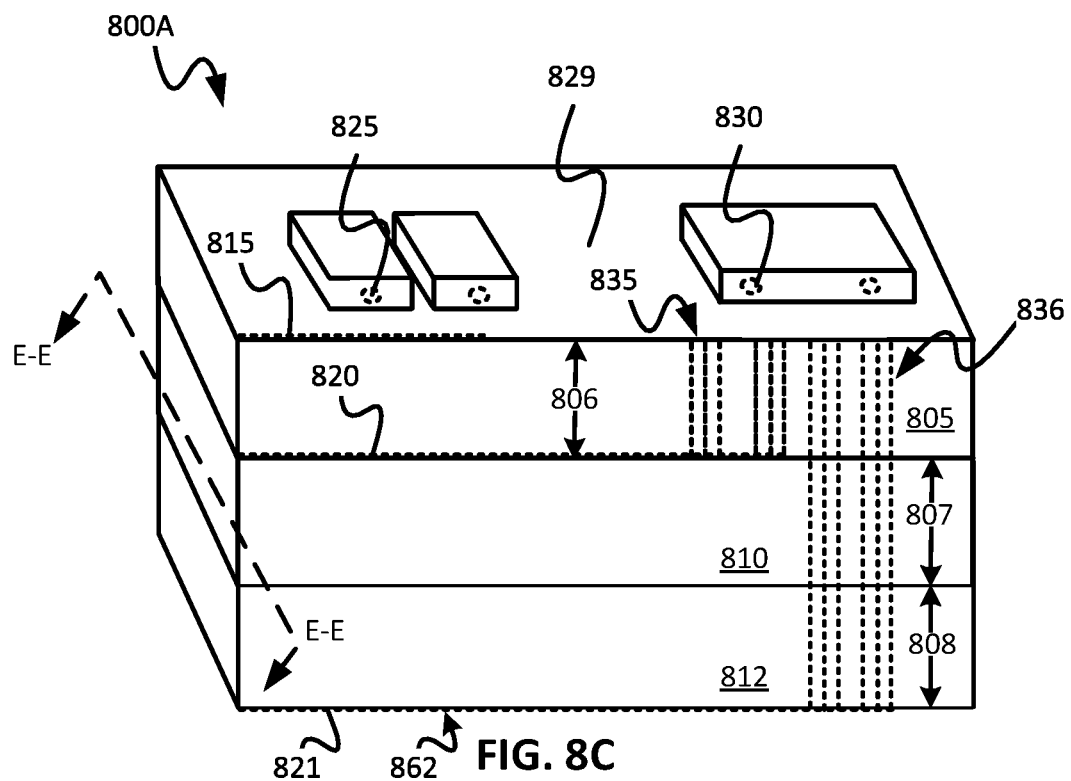
FIG. 8C is an example cross-sectional view of a FPC configured to provide both power and RF signal lines in accordance with an embodiment of the present disclosure.
Figure 8D:
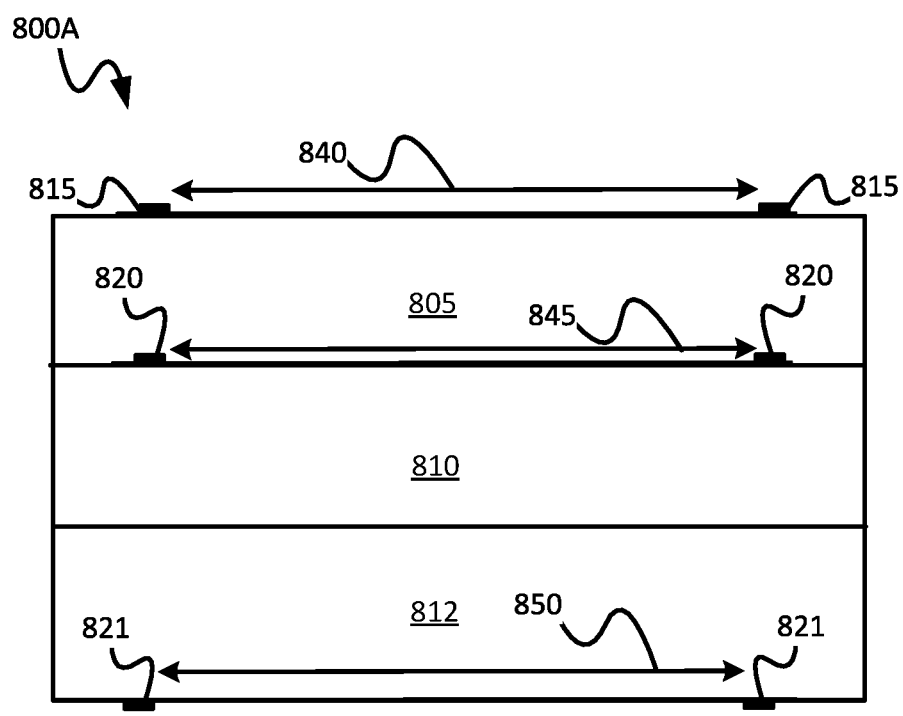
FIG. 8D is an example cross-sectional view of the FPC of FIG. 8B taken along the line E-E.

As further shown, the first insulating layer 805 includes a first set of conductive traces 815 or transmission lines 815 disposed on surface 829 (or external surface 829) for carrying a first set of electrical signals. The second insulating layer 810 may include a second set of conductive traces 820 disposed on surface 850 (shown as hidden lines) for carrying a second set of electrical signals. The third set of conductive traces 821 (shown as hidden lines) may be disposed on surface 861, which is opposite of surface 860, and may be configured to carry a third set of electrical signals. The first and second set of conductive traces 815, 820 may also be referred to as a first signal layer, and a second signal layer, respectively. The particular placement of the first and second sets of conductive traces 815, 820 may be disposed at varying locations on an associated insulating layer and this disclosure is not necessarily limited to the embodiment shown in FIG. 8A. In addition, although the FPC 800 is shown as having two insulation layers and three signal layers, such a configuration is non-limiting. For example, in some instances the FPC 800 may have more than three insulation layers, with each insulation layer having one or more associated signal layers, e.g., sets of conductive traces, disposed therein, such as shown in FIGS. 8C and 8D.

In an embodiment, the first set of electrical signals carried by the first set of conductive traces 815 are radio frequency (RF) signals (e.g., a data signal). The RF signals may be utilized to, for example, drive a laser diode at a high frequency in the context of a TOSA, or to receive detected channel wavelengths via photodiodes in the context of a ROSA. The RF signals may comprise high-frequency signals that benefit from relatively short and direct (e.g., without bends) trace routes. Vias, such as vias 835 and 836 may compromise the integrity of the RF signaling. To this end, the RF signals may be exclusively carried by the first set of conductive traces 815 on top of mounting surface 829 to mitigate signal degradation.

The second and third set of conductive traces may carry a direct current (DC) signal (e.g., power) and/or a low-frequency control signal. The low-frequency control signal may be utilized to switch optical components on and off, e.g., such as a laser diode, and to regulate laser power and other operating characteristics. In addition, one or both of the second and third set of conductive traces 820, 821 may be used as an RF ground reference plane. For example, the second set of conductive traces 820 may be used as an RF ground reference plane and the third set of conductive traces 821 may be used to carry DC and/or other low-frequency control signals. In this instance, the second set of conductive traces 820 carrying the RF ground reference plane signal may advantageously isolate the RF signals carried by the first set of conductive traces 815 from the DC and other low-frequency control signals carried by the third set of conductive traces 821. This may significantly minimize or otherwise reduce interference between RF signals being transmitted by the first set of conductive traces 815 and the DC and other low-frequency control signals carried by the third set of conductive traces 821.

Continuing with FIG. 8, the first insulating layer 805 may define a mounting surface 829 that includes one or more conductive terminals, such as conductive terminals 825 and 830. The first and second conductive terminals 825, 830 may be positioned on a single (or the same) side, e.g., surface 829, of the FPC 800. Each of the first and second set of conductive terminals may be electrically coupled one or more of the first, second and third set of conductive traces 815, 820, and 821.

One or more vias 835 may extend from the second insulating layer 810 through the first insulating layer 805 to provide electrical connectivity between the second set of conductive traces 820 and the first and second set of conductive terminals 825, 830, for example. In addition, one or more vias 836 may extend through the second insulating layer 810 and the first insulating layer 805 to provide electrical connectivity between the third set of conductive traces 821 and the first and second set of conductive terminals 825, 830, for example. Thus, the vias 835 and 836 allow for a single surface, e.g., surface 829, of the FPC 800 to mount a desired number of components and/or electrical connectors. In this embodiment, all of the desired components and/or electrical connectors may be disposed on a single side of the FPC 800 to the exclusion of other sides of the FPC 800, and consequently, an overall thickness of the FPC 800 may be reduced compared to a situation where two or more sides of the FPC 800 include one or more components and/or electrical connectors. The FPC 800 may include N number of vias at various locations and the particular configuration shown in FIG. 8A should not be construed as limiting.

As shown, the first conductive terminals 825 may be electrically coupled to a plurality of separate components. For example, the first conductive terminals 825 may be electrically coupled to conductive pads, for example conductive pads 610, 630, 710, or 730 of FIGS. 6 and 7. As also shown, the second conductive terminals 830 may be electrically coupled to a single component. For example, the second conductive terminals 830 may be electrically coupled a pluggable connector, e.g., the pluggable connector 615 or 715. However, such a configuration is not required. For example, the first conductive terminals 825 may be electrically coupled to a single component and/or the second conductive terminals 830 may be electrically coupled to one or more conductive pads.

As shown, each set of conductive traces include traces which are co-planar within a given insulation layer. For example, each of the conductive traces are shown in FIG. 8B as co-planar relative to each other. In other cases conductive traces within a given layer may not necessarily be co-planar with each other. The first set of conductive traces 815 may be separated from each other by a separation distance 840, with the separation distance 840 measuring in the range of 1.5 mm to 3 mm to prevent interference between traces. The second set of conductive traces 820 may include a separation distance 845 which is less than separation distance 840. For example, the separation distance 845 may measure in the range of 0.1 mm to 0.3 mm. This relatively small separation distance may allow for closer patterning of traces without concern for interference between transmission lines in scenarios where the second set of conductive traces 820 carry a ground signal to act as an RF ground plane, for example. The third set of conductive traces 845 may include a separation distance 850 of 0.1 to 0.3 mm, for example.

In some instances, each of the separation distances 840, 845, and 850 measure substantially the same. In other cases, at least two of the separation distances 840, 845 and 850 measure substantially the same. In still other cases, the separation distance 840 may measure larger than both of the separation distances 845 and 850. For example, the separation distance 845 may measure about one fifth, or less, than that of the separation distance 840. In another example, the separation distance 840 of the first set of conductive traces measures at least twice that of the separation distance 845 of the second set of conductive traces 820 and/or that of the separation distance 850 of the second set of traces 821.

In some instances, one or more of the conductive traces included in the first, second and third set of conductive traces 815, 820, 821 may include electromagnetic shielding. For example, a solid copper or silver shield may be used. However, a solid copper or silver shield may decrease the flexibility of the FPC 800. Therefore, in some instances, the copper or silver shield may be a crosshatched copper or silver shield. A crosshatched copper or silver shield may increase the flexibility of the FPC 800 relative to an FPC using a solid copper or silver shield.

Turning to FIGS. 8C and 8D, another example FPC 800A is shown in accordance with an embodiment of the present disclosure. As shown, the FPC 800A is substantially similar to that of the FPC 800 of FIGS. 8C and 8D, and for this reason the description of which will not be repeated for brevity. However, the FPC 800A includes a third insulation layer 812. The third insulation layer may include a thickness 808 the same as or different from the thickness of the insulation layers 805 and 810. The third set of conductive traces 821 may be disposed on an outer layer 862 of the third insulation layer 812. Vias 836 may extend through the first, second and third insulation layers 805, 810 and 812, to make electrical contact with one or more terminals, e.g., terminals 825, 830.

Figure 9:
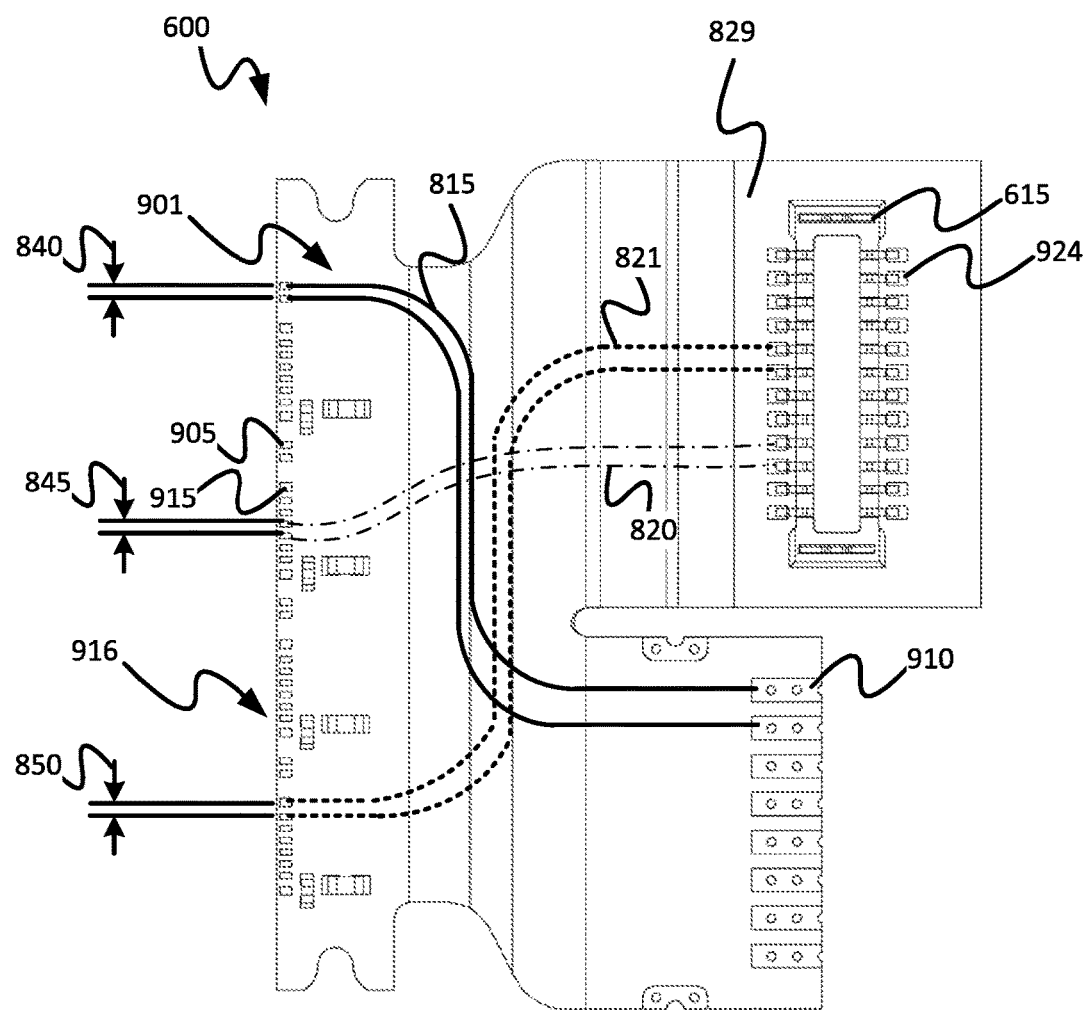
FIG. 9 shows a top plan view of the example FPC of FIG. 6 in accordance with an embodiment of the present disclosure.

FIG. 9, with additional reference to FIGS. 8A-8D, shows an example plan view of the FPC 600 of FIG. 6 in accordance with an embodiment of the present disclosure. The FPC 600 may be implemented using the multi-layer configuration as discussed above with regard to the embodiments of FIGS. 8A-8D. As shown, the FPC 600 includes an RF circuit 901 that may include one or more transmit RF conductive pads 905 electrically coupled to one or more receive RF conductive pads 910 using one or more of the conductive traces included in the first set of conductive traces 815. The RF conductive pads 910 may receive one or more RF signals to be used for driving the laser packages 285-1 to 285-N (FIG. 2A). In other words, the RF signals are transmitted over one or more of the conductive traces included in the first set of conductive traces 815. Therefore, the first set of conductive traces 815 may be disposed one the same layer of the multilayer FPC 600.

In order to minimize or otherwise reduce electromagnetic interference between RF signals transmitted on the first set of conductive traces 815, each of the conductive traces included in the first set of conductive traces 815 are separated at least by the separation distance 840. In some instances, the separation distance 840 may increase as the first set of conductive traces 815 approach the receive RF conductive pads 910, such as shown. In embodiments, the separation distance 840 is non-zero such that each of the conductive traces in the first set of conductive traces 815 do not cross over each other within RF circuit 901.

As shown, the FPC 600 also includes a transmit DC circuit 916 having a set of DC conductive pads 915 and at least one conductive terminal 924, which may be electrically coupled to the pluggable connector 615 of FIG. 6. The set of DC conductive pads 915 may be electrically coupled to, for example, the at least one conductive terminal 924 using the third set of conductive traces 821. However, as shown, at least one of the conductive traces within the third set of conductive traces 821 crosses at least one of the conductive traces within the first set of conductive traces 815 and/or the second set of conductive traces 820. In other words, at least one of the conductive traces included in the third set of conductive traces 821 passes under (or over) at least one of the conductive traces included in the first set of conductive traces 815 and/or second set of conductive traces 820 by virtue of being positioned on different layers of the FPC 600.

In some instances, at least one of the conductive traces in the third set of conductive traces 821 may be able to be routed such that it does not cross over any of the conductive traces included within the first set of conductive traces, e.g., using via 835. As a result, at least one of the conductive traces included within the third set of conductive traces 821 may be routed through the same layer as the second set of conductive traces 820, e.g., the second insulating layer 810 of FIG. 8A.

In some embodiments, each of the third set of conductive traces 821 may be separated by the separation distance 850. The separation distance 850 may increase or decrease along the length of the transmit DC circuit 916. Therefore, in some instances, the conductive traces within the third set of conductive traces 821 may be relatively close to each other.

In other words, the separation distance 850 may be about 0.1 mm or less, for example, at one or more locations in the DC circuit 916.

Figure 10:
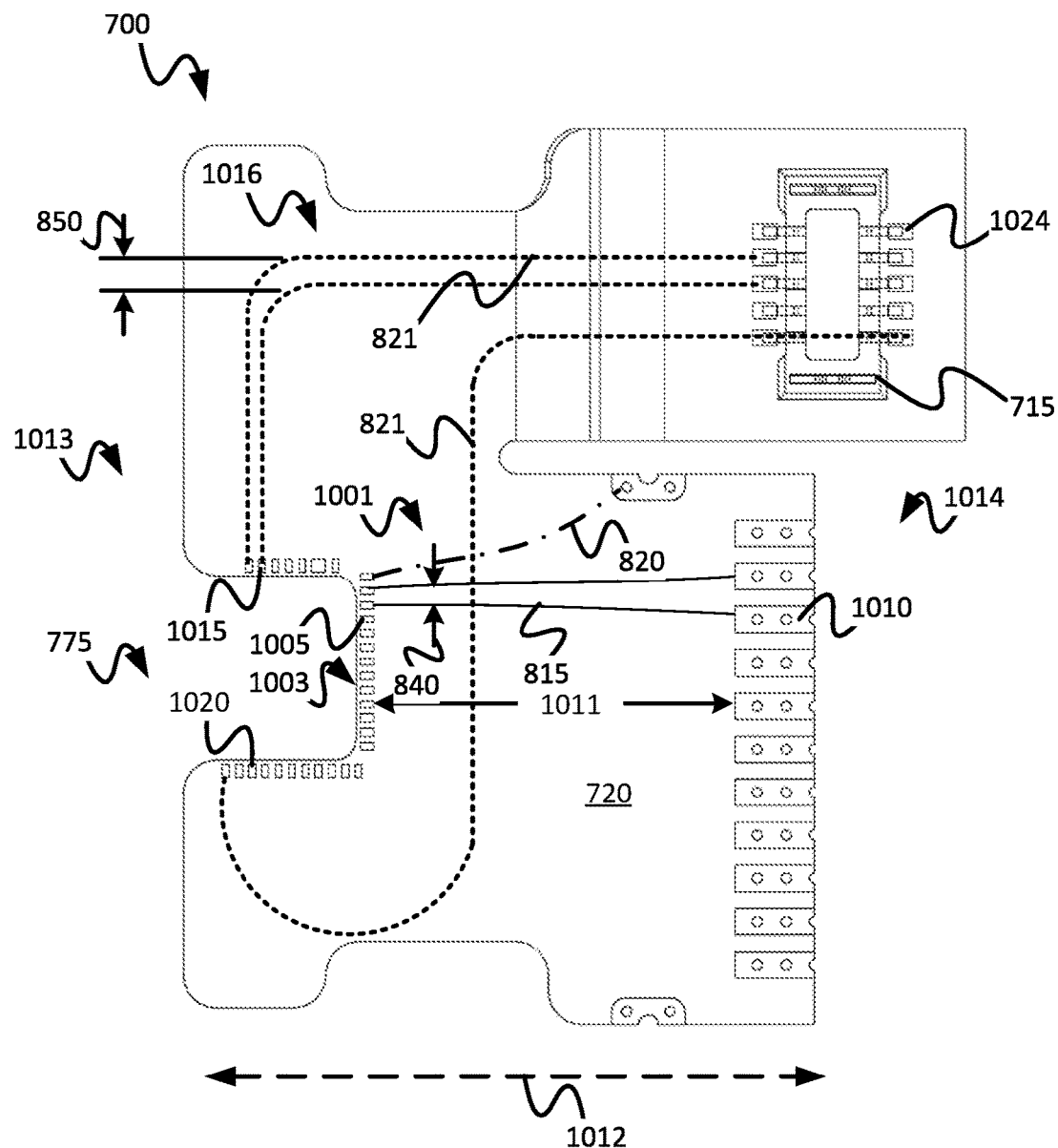
FIG. 10 shows a top plan view of the example FPC of FIG. 8A or 8C in accordance with an embodiment of the present disclosure.

FIG. 10 shows an example plan view of the FPC 700 of FIG. 7 in accordance with an embodiment of the present disclosure. The FPC 700 may be implemented using the multi-layer configuration as discussed above with regard to the embodiments of FIG. 8A-8D. As shown, the FPC 700 includes a receive RF circuit 1001 that may include a set of receive RF conductive pads 1005 electrically coupled to receive RF conductive pads 1010 using the first set of conductive traces 815. The receive RF conductive pads 1005 may receive one or more RF signals from the array of photodiodes and associated TIAs 350 (FIG. 4). As shown, the first set of conductive traces 815 extend generally along a longitudinal axis 1012 from a receive end 1013 of the FPC 700 to a system coupling end 1014 of the first arm 720, e.g., which may electrically couple to receive connecting circuit 108. As shown, the receive RF conductive pads 1005 may be positioned at a distal end 1003 of the cut-out 775 such that a separation distance 1011 between the conductive pads 1005, 1010 is minimized.

In order to minimize or otherwise reduce electromagnetic interference between RF signals transmitted on the first set of conductive traces 815, each of the conductive traces in the first set of conductive traces 815 are separated at least by the separation distance 840. As shown, the separation distance 840 may increase as the first set of conductive traces 815 get closer to the receive RF conductive pads 1010. In other instances, the separation distance 840 may not change as the first set of conductive traces 815 get closer to the receive RF conductive pads 1010. In embodiments, the separation distance 840 for the entire RF circuit 1001 is non-zero such that each of the conductive traces included in the first set of conductive traces 815 do not cross.

As shown, the FPC 700 also includes a receive DC circuit 1016 having a first set of DC conductive pads 1015, a second set of DC conductive pads 1020, and at least one conductive terminal 1024, which may be electrically coupled to, for example, the pluggable connector 715 of FIG. 7. In some instances, the first set of DC conductive pads 1015 are positioned opposite the second set of DC conductive pads 1020 across the cut-out 775. The first set of DC conductive pads 1015 and the second set of DC conductive pads 1020 are electrically coupled to the at least one conductive terminal 1024 using one or more of the conductive traces included in the third set of conductive traces 821. However, and as shown, in order for one or more of the conductive traces included in the third set of conductive traces 821 to electrically couple the DC conductive pads 1015, 1020 to the at least one conductive terminal 1024, at least one of the conductive traces within the third set of conductive traces 821 crosses at least one of the conductive traces of the first set of conductive traces 815. In other words, at least one of the conductive traces in the third set of conductive traces 821 passes under (or over) at least one of the conductive traces in the first set of conductive traces 815 by virtue of being positioned within a different layer of the FPC 700 (e.g., the third layer 812 of FIG. 8).

Additional Example Aspects

In accordance with an aspect of the present disclosure an optical transceiver module is disclosed. The optical transceiver module comprising a housing, a receive connecting circuit, a receiver optical subassembly (ROSA) arrangement disposed in the housing, and a first flexible printed circuit (FPC) having a first region electrically coupled to the receive connecting circuit and a second region electrically coupled to the ROSA arrangement, the first FPC comprising a first plurality of conductive traces for providing a radio frequency (RF) signal between the ROSA arrangement and the receive connecting circuit, a second plurality of conductive traces for providing a power waveform, and wherein the first plurality of conductive traces is electrically isolated from the second plurality of conductive traces to prevent interference with the RF signal.

In accordance with another aspect of this disclosure an optical transceiver module is disclosed. The optical transceiver module comprising a transmit connecting circuit and a receive connecting circuit each disposed at least partially within the housing, a receiver optical subassembly (ROSA) arrangement disposed in the housing, a first flexible printed circuit (FPC) having a first region electrically coupled to the receive connecting circuit and a second region electrically coupled to the ROSA arrangement, the first FPC comprising a first plurality of conductive traces for providing a radio frequency (RF) signal between the ROSA arrangement and the receive connecting circuit, a second plurality of conductive traces for providing a power waveform, and wherein the first plurality of conductive traces is electrically isolated from the second plurality of conductive traces to prevent interference with the RF signal, a transmitter optical subassembly (TOSA) arrangement disposed in the housing, and a second flexible printed circuit (FPC) having a first region electrically coupled to the transmit connecting circuit and a second region electrically coupled to the TOSA arrangement, the second FPC comprising a first plurality of conductive traces for providing a radio frequency (RF) signal between the transmit connecting circuit and the TOSA arrangement, a second plurality of conductive traces for providing a power waveform, and wherein the first plurality of conductive traces is electrically isolated from the second plurality of conductive traces to prevent interference with the RF signal.

In accordance with yet another aspect of the present disclosure and optical transceiver is disclosed. The optical transceiver comprising a housing, a transmit connecting circuit and a receive connecting circuit each disposed at least partially within the housing, a receiver optical subassembly (ROSA) arrangement disposed in the housing, a first flexible printed circuit (FPC) having a first region electrically coupled to the receive connecting circuit and a second region electrically coupled to the ROSA arrangement, the first FPC comprising a first plurality of conductive traces for providing a radio frequency (RF) signal between the ROSA arrangement and the receive connecting circuit, a second plurality of conductive traces for providing a power waveform, and wherein the first plurality of conductive traces is electrically isolated from the second plurality of conductive traces to prevent interference with the RF signal, a transmitter optical subassembly (TOSA) arrangement disposed in the housing, and a second flexible printed circuit (FPC) having a first region electrically coupled to the transmit connecting circuit and a second region electrically coupled to the TOSA arrangement, the second FPC comprising a first plurality of conductive traces for providing a radio frequency (RF) signal between the receive connecting circuit and the TOSA arrangement, a second plurality of conductive traces for providing a power waveform, and wherein the first plurality of conductive traces is electrically isolated from the second plurality of conductive traces to prevent interference with the RF signal, a printed circuit board assembly (PCBA) electrically coupled to the first and second FPCs.

While the principles of the disclosure have been described herein, it is to be understood by those skilled in the art that this description is made only by way of example and not as a limitation as to the scope of the disclosure. Other embodiments are contemplated within the scope of the present disclosure in addition to the exemplary embodiments shown and described herein. Modifications and substitutions by one of ordinary skill in the art are considered to be within the scope of the present disclosure, which is not to be limited except by the following claims.

What is claimed is:

1. An optical transceiver module comprising:
   a housing;
   a receive connecting circuit;
   a receiver optical subassembly (ROSA) arrangement disposed in the housing; and
   a first flexible printed circuit (FPC) having a first region electrically coupled to the receive connecting circuit and a second region electrically coupled to the ROSA arrangement, the first FPC comprising:
      a first plurality of conductive traces for providing a radio frequency (RF) signal between the ROSA arrangement and the receive connecting circuit;
      a second plurality of conductive traces for providing a power waveform;
      at least one insulating layer disposed between the first and second plurality of conductive traces; and
      wherein the first plurality of conductive traces is electrically isolated from the second plurality of conductive traces to prevent interference with the RF signal.

2. The optical transceiver module of claim 1, wherein the first FPC further comprises an RF ground reference plane disposed between the first and second plurality of conductive traces to provide electrical isolation between the RF signal of the first plurality of conductive traces and the power waveform of the second plurality of conductive traces.

3. The optical transceiver module of claim 1, wherein the first FPC includes a cut-out for receiving an array of photodiodes associated with the ROSA arrangement.

4. The optical transceiver module of claim 3, wherein a plurality of conductive pads are disposed around a perimeter of the cut-out and are electrically coupled to respective conductive traces of the second plurality of conductive traces, and wherein a first conductive pad and a second conductive pad of the plurality of conductive pads are positioned on opposite sides of the cut-out from each other.

5. The optical transceiver module of claim 1, wherein the at least one insulating layer comprises at least first and second insulating layers, the second insulating layer being disposed on the first insulating layer, and wherein the first plurality of conductive traces are disposed on an external surface of the first insulating layer and the second plurality of conductive traces are disposed on the second insulating layer.

6. The optical transceiver module of claim 5, wherein the first FPC includes a conductive terminal disposed on the external surface of the first insulating layer, and wherein a conductive trace of the second plurality of conductive traces extends through the first insulating layer to electrically couple to the conductive terminal.

7. The optical transceiver module of claim 1, wherein the first FPC further comprises a first arm portion and a second arm portion, the first and second arm portions extending along a longitudinal axis of the first FPC and separated from each other by a gap.

8. The optical transceiver module of claim 7, wherein the first FPC further comprises a first flexible region extending between the first arm portion and an end of the FPC.

9. The optical transceiver module of claim 1, wherein the first plurality of conductive traces include a separation spacing between conductive traces that is greater than a separation spacing between conductive traces of the second plurality of conductive traces.

10. An optical transceiver module comprising:
a housing;
a transmit connecting circuit and a receive connecting circuit each disposed at least partially within the housing;
a receiver optical subassembly (ROSA) arrangement disposed in the housing;
a first flexible printed circuit (FPC) having a first region electrically coupled to the receive connecting circuit and a second region electrically coupled to the ROSA arrangement, the first FPC comprising:
 a first plurality of conductive traces for providing a radio frequency (RF) signal between the ROSA arrangement and the receive connecting circuit;
 a second plurality of conductive traces for providing a power waveform; and
 wherein the first plurality of conductive traces is electrically isolated from the second plurality of conductive traces to prevent interference with the RF signal;
a transmitter optical subassembly (TOSA) arrangement disposed in the housing; and
a second flexible printed circuit (FPC) having a first region electrically coupled to the transmit connecting circuit and a second region electrically coupled to the TOSA arrangement, the second FPC comprising:
 a first plurality of conductive traces for providing a radio frequency (RF) signal between the transmit connecting circuit and the TOSA arrangement;
 a second plurality of conductive traces for providing a power waveform; and
 wherein the first plurality of conductive traces is electrically isolated from the second plurality of conductive traces to prevent interference with the RF signal.

11. The optical transceiver module of claim 10, wherein the second FPC includes a cut-out for receiving an array of photodiodes associated with the ROSA arrangement.

12. The optical transceiver module of claim 11, wherein a plurality of conductive pads is disposed around a perimeter of the cut-out of the first FPC, each of the plurality of conductive pads being electrically coupled to an associated conductive trace of the second plurality of conductive traces, and wherein a first conductive pad and a second conductive pad of the plurality of conductive pads are disposed on opposite sides of the cut-out from each other.

13. The optical transceiver module of claim 10, wherein each of the first and second FPCs further comprise at least a first, second, and third insulating layer, the second insulating layer being coupled between the first and second insulating layers, and wherein the first plurality of conductive traces is disposed on the first insulating layer and the second plurality of conductive traces is disposed on the third insulating layer.

14. The optical transceiver module of claim 13, wherein the first FPC includes a conductive terminal disposed on an external surface of the first insulating layer, and wherein a conductive trace of the second plurality of conductive traces extends through the first and second insulating layers to electrically couple to the conductive terminal.

15. The optical transceiver module of claim 10, wherein the first FPC further comprises a first arm portion and a second arm portion, the first and second arm portions extending along a longitudinal axis of the first FPC and separated from each other by a gap.

16. The optical transceiver module of claim 10 implemented as a Quad Small Form-Factor Pluggable transceiver.

17. An optical transceiver comprising:
a housing;
a transmit connecting circuit and a receive connecting circuit each disposed at least partially within the housing;
a receiver optical subassembly (ROSA) arrangement disposed in the housing;
a first flexible printed circuit (FPC) having a first region electrically coupled to the receive connecting circuit and a second region electrically coupled to the ROSA arrangement, the first FPC comprising:
 a first plurality of conductive traces for providing a radio frequency (RF) signal between the ROSA arrangement and the receive connecting circuit;
 a second plurality of conductive traces for providing a power waveform; and
 wherein the first plurality of conductive traces is electrically isolated from the second plurality of conductive traces to prevent interference with the RF signal;
a transmitter optical subassembly (TOSA) arrangement disposed in the housing; and
a second flexible printed circuit (FPC) having a first region electrically coupled to the transmit connecting circuit and a second region electrically coupled to the TOSA arrangement, the second FPC comprising:
 a first plurality of conductive traces for providing a radio frequency (RF) signal between the receive connecting circuit and the TOSA arrangement;
 a second plurality of conductive traces for providing a power waveform; and
 wherein the first plurality of conductive traces is electrically isolated from the second plurality of conductive traces to prevent interference with the RF signal;
a printed circuit board assembly (PCBA) electrically coupled to the first and second FPCs.

18. The optical transceiver of claim 17, wherein the first FPC includes a cut-out for receiving an array of photodiodes associated with the ROSA arrangement.

19. The optical transceiver of claim 18, wherein a plurality of conductive pads is disposed around a perimeter of the cut-out of the first FPC, each of the plurality of conductive pads being electrically coupled to an associated conductive trace of the second plurality of conductive traces, and wherein a first conductive pad and a second conductive pad of the plurality of conductive pads are disposed on opposite sides of the cut-out from each other.

20. The optical transceiver module of claim 17 implemented as a Quad Small Form-Factor Pluggable transceiver.

* * * * *